United States Patent
Gong et al.

(10) Patent No.: US 11,430,510 B2
(45) Date of Patent: Aug. 30, 2022

(54) MULTI-LEVEL FERROELECTRIC FIELD-EFFECT TRANSISTOR DEVICES

(71) Applicant: International Business Machines Corporation, Armonk, NY (US)

(72) Inventors: Nanbo Gong, White Plains, NY (US); Takashi Ando, Eastchester, NY (US); Guy M. Cohen, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/119,032

(22) Filed: Dec. 11, 2020

(65) Prior Publication Data

US 2022/0189546 A1 Jun. 16, 2022

(51) Int. Cl.
  *G11C 11/56*  (2006.01)
  *G11C 11/22*  (2006.01)
  *H01L 27/1159*  (2017.01)
  *H01L 29/78*  (2006.01)

(52) U.S. Cl.
  CPC ........ *G11C 11/5657* (2013.01); *G11C 11/223* (2013.01); *G11C 11/2273* (2013.01); *G11C 11/2275* (2013.01); *H01L 27/1159* (2013.01); *H01L 29/78391* (2014.09)

(58) Field of Classification Search
  None
  See application file for complete search history.

(56) References Cited

U.S. PATENT DOCUMENTS

| | | |
|---|---|---|
| 7,700,985 B2 | 4/2010 | Xi et al. |
| 9,799,381 B1 | 10/2017 | Tortorelli et al. |
| 10,056,393 B2 | 8/2018 | Schröder et al. |

(Continued)

FOREIGN PATENT DOCUMENTS

| | | |
|---|---|---|
| CN | 1812128 A | 8/2006 |
| DE | 102004011432 A1 | 9/2005 |
| WO | PCT/CN2021/131810 | 2/2022 |

OTHER PUBLICATIONS

T. P. Ma et al., "Retention and Endurance of FeFET Memory Cells," IEEE 11th International Memory Workshop (IMW), May 12-15, 2019, pp. 1-4.

(Continued)

*Primary Examiner* — Tan T. Nguyen
(74) *Attorney, Agent, or Firm* — Samuel Waldbaum; Ryan, Mason & Lewis, LLP

(57) ABSTRACT

A device comprises a non-volatile memory and a control system. The non-volatile memory includes an array of non-volatile memory cells, wherein at least one non-volatile memory cell includes a ferroelectric field-effect transistor (FeFET) device. The FeFET device includes first and second source/drain regions, and a gate structure which comprises a ferroelectric layer, and a gate electrode disposed over the ferroelectric layer. The ferroelectric layer comprises a first region adjacent to the first source/drain region and a second region adjacent to the second source/drain region. The control system is operatively coupled to the non-volatile memory to program the FeFET device to have a logic state among a plurality of different logic states. At least one logic state among the plurality of different logic states corresponds to a polarization state of the FeFET device in which the first and second regions of the ferroelectric layer have respective remnant polarizations with opposite polarities.

19 Claims, 11 Drawing Sheets

(56) References Cited

U.S. PATENT DOCUMENTS

| | | |
|---|---|---|
| 10,090,036 B2 | 10/2018 | Van Houdt |
| 10,510,862 B2 | 12/2019 | Ino et al. |
| 10,714,242 B2 | 7/2020 | Abel et al. |
| 11,244,999 B2 | 2/2022 | Frank et al. |
| 2006/0118844 A1 | 6/2006 | Kijima et al. |
| 2010/0252867 A1 | 10/2010 | Park |
| 2017/0162250 A1 | 6/2017 | Slesazeck et al. |
| 2017/0338350 A1 | 11/2017 | Flachowsky et al. |
| 2019/0189311 A1 | 6/2019 | Abel et al. |
| 2019/0326387 A1 | 10/2019 | Frank et al. |
| 2020/0203380 A1 | 6/2020 | Prasad et al. |

OTHER PUBLICATIONS

G. W. Burr et al., "Recent Progress in Phase-Change Memory Technology," IEEE Journal on Emerging and Selected Topics in Circuits and Systems, Jun. 2016, vol. 6, No. 2, pp. 146-162.

C. G. Sodini, "Lecture 9, MOSFET (II), MOSFET I-V Characteristics (contd.)," http://web.mit.edu/6.012/www/SP07-L9.pdf, Mar. 8, 2007, 15 pages.

M. Jerry et al., "Ferroelectric FET Analog Synapse for Acceleration of Deep Neural Network Training", IEEE International Electron Devices Meeting (IEDM), Dec. 2-6, 2017, pp. 6.2.1-6.2.4.

V. Milo et al., "Memristive and CMOS Devices for Neuromorphic Computing", Materials, Jan. 1, 2020, vol. 3, No. 1, 33 pages.

N. Wrachien, "Advanced Memories to Overcome the Flash Memory Weaknesses: A Radiation Viewpoint Reliability Study," http://paduaresearch.cab.unipd.it/2494/1/Tesi18final.pdf, 2010, 197 pages.

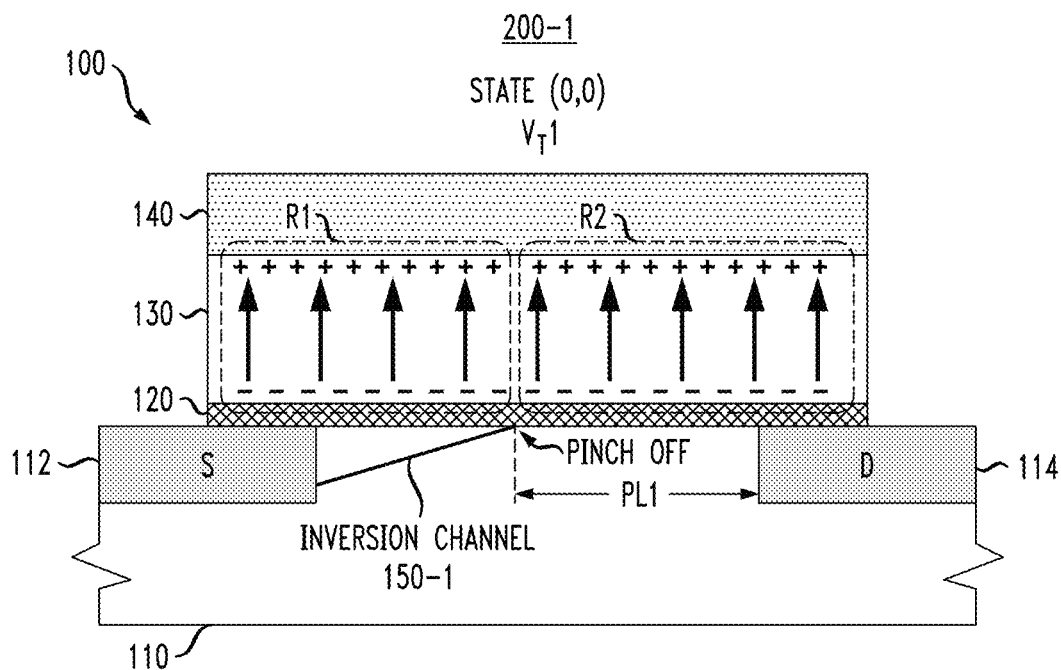
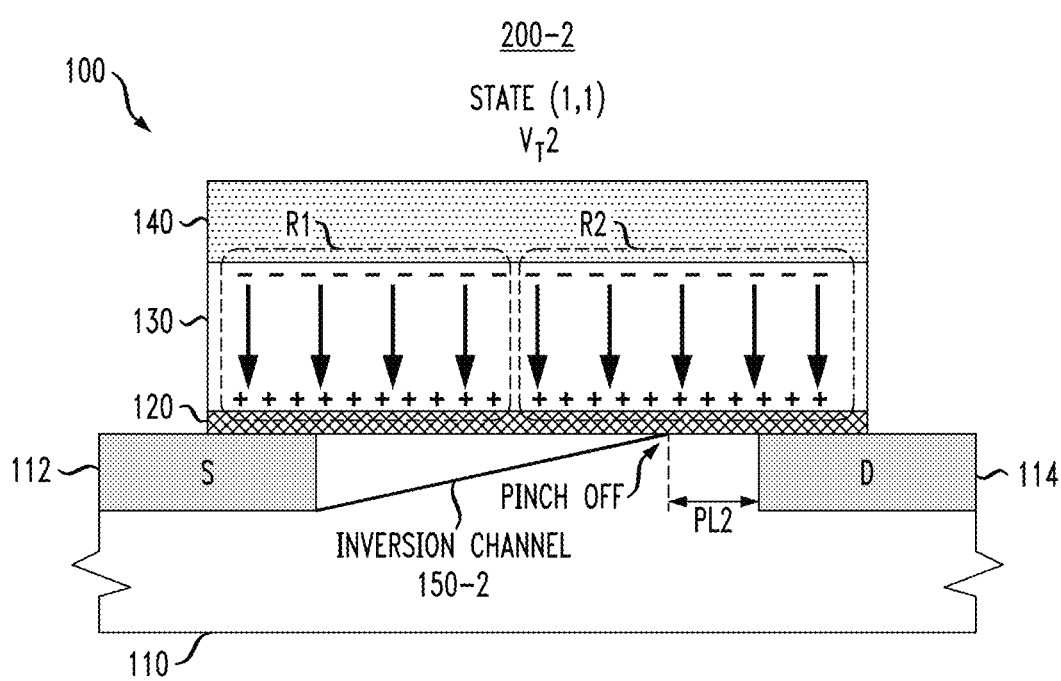

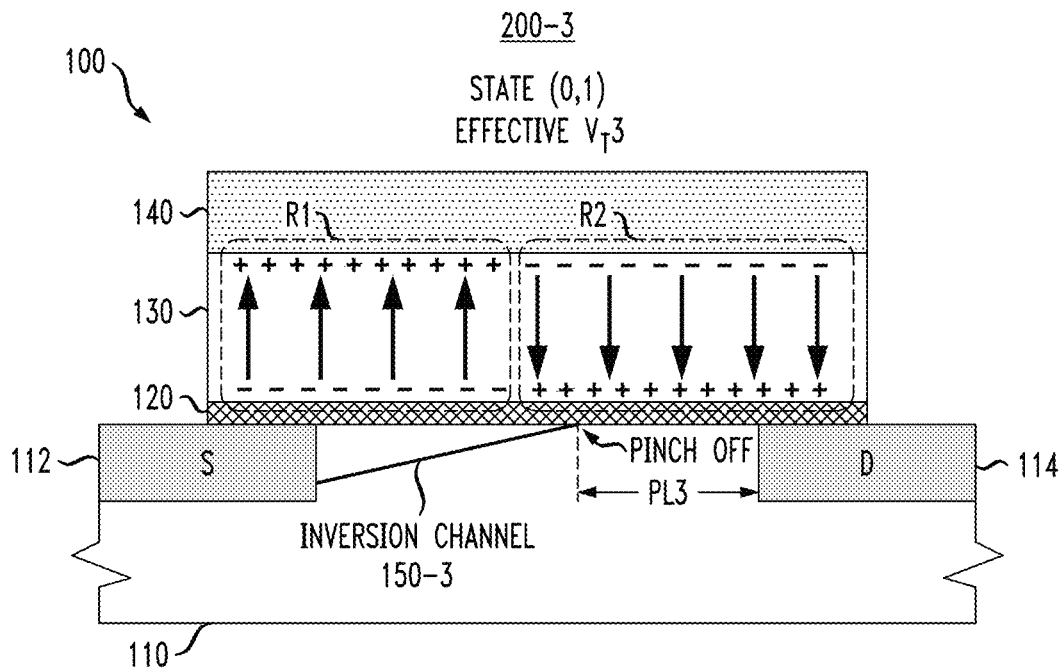
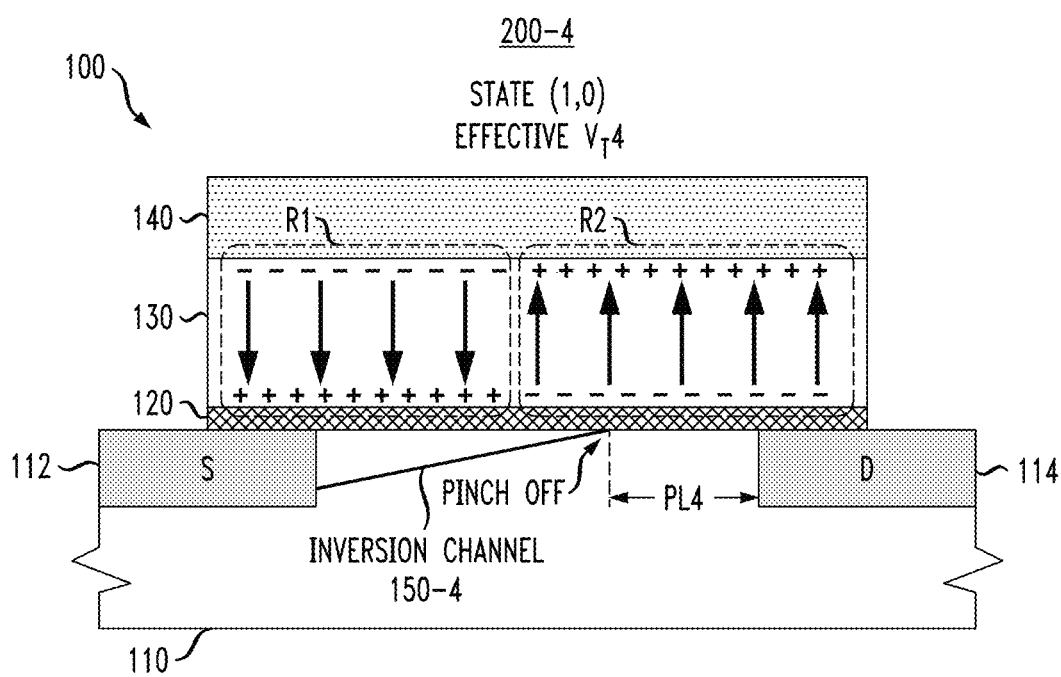

310

320

| VG_READ (APPLIED TO GATE/WL) VD_READ (APPLIED TO DRAIN/BL) VS=0 (BY GROUNDING SOURCE/SUBSTRATE/SL) |||
|---|---|---|
| THRESHOLD VOLTAGE | REFERENCE $I_D$ | LOGIC STATE |
| $V_T1$ | $I_D1$ | 0,0 |
| $V_T2$ | $I_D2$ | 1,1 |
| EFFECTIVE $V_T3$ | $I_D3$ | 0,1 |
| EFFECTIVE $V_T4$ | $I_D4$ | 1,0 |

<u>400-1</u>

STATE (0,0)
$V_T 1$

<u>400-2</u>

STATE (1,1)
$V_T 2$ 400-5

$V_T2$ STATE → EFFECTIVE $V_T5$ STATE 400-6

$V_T2$ STATE → EFFECTIVE $V_T6$ STATE

MULTI-LEVEL FERROELECTRIC FIELD-EFFECT TRANSISTOR DEVICES

BACKGROUND

This disclosure relates generally to ferroelectric field-effect transistor (FeFET) devices and the implementation of FeFET devices for non-volatile memory applications. In the field of solid-state electronics, the use of ferroelectric materials is becoming increasingly popular for various applications which implement ferroelectric devices such as FeFET devices, negative capacitance FETs, etc., for low-voltage logic and non-volatile memory applications. Ferroelectric materials are materials that have the ability to become spontaneously polarized in the presence of an electric field (referred to as coercive field), and retain remnant polarization when unbiased. The remnant polarization refers to the polarization charge that remains within the ferroelectric material, positive or negative, after an external bias has been removed. The stability in the remnant polarization charges of ferroelectric materials allows an FeFET device to retain its logic state even when power is removed, thereby making FeFET devices suitable candidates for non-volatile applications. In addition, FeFET devices have fast switching, long retention, and reasonable endurance characteristics, which are other characteristics which make FeFET devices suitable candidates for non-volatile memory applications.

SUMMARY

Embodiments of the disclosure include multi-level FeFET devices, methods for reading and programming multi-level FeFET devices, and non-volatile memory systems that implement multi-level FeFET devices.

An exemplary embodiment includes a device which comprises a non-volatile memory and a control system. The non-volatile memory comprises an array of non-volatile memory cells, wherein at least one non-volatile memory cell comprises an FeFET device. The FeFET device comprises a first source/drain region and a second source/drain region disposed in an upper surface of a substrate; and a gate structure which comprises a ferroelectric layer disposed over the substrate, and a gate electrode disposed over the ferroelectric layer. The ferroelectric layer comprises a first region adjacent to the first source/drain region and a second region adjacent to the second source/drain region. The control system is operatively coupled to the non-volatile memory to program the FeFET device of the at least one non-volatile memory cell to have a logic state among a plurality of different logic states. At least one logic state among the plurality of different logic states corresponds to a polarization state of the FeFET device in which the first and second regions of the ferroelectric layer have respective remnant polarizations with opposite polarities.

Other embodiments will be described in the following detailed description of exemplary embodiments, which is to be read in conjunction with the accompanying figures.

BRIEF DESCRIPTION OF THE DRAWINGS

FIGS. 2A, 2B, 2C and 2D schematically illustrate different polarization states of an FeFET device to implement a multi-level FeFET device, according to an exemplary embodiment of the disclosure.

DETAILED DESCRIPTION

Exemplary embodiments of the disclosure will now be described in further detail with regard multi-level FeFET devices, methods for reading and programming multi-level FeFET devices, and non-volatile memory systems that implement multi-level FeFET devices. It is to be understood that the various layers, structures, and regions of FeFET devices shown in the accompanying drawings are schematic illustrations that are not drawn to scale. In addition, for ease of explanation, one or more layers, structures, and regions of a type commonly used to form FeFET devices or structures may not be explicitly shown in a given drawing. This does not imply that any layers, structures, and regions not explicitly shown are omitted from the actual semiconductor structures.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

The term "exemplary" as used herein means "serving as an example, instance, or illustration". Any embodiment or design described herein as "exemplary" is not to be construed as preferred or advantageous over other embodiments or designs. The word "over" as used herein to describe the orientation of a given feature with respect to another feature means that the given feature may be disposed or formed "directly on" (i.e., in direct contact with) the other feature, or that the given feature may be disposed or formed "indirectly on" the other feature with one or more intermediate features disposed between the given feature and the other feature.

Figure 1:
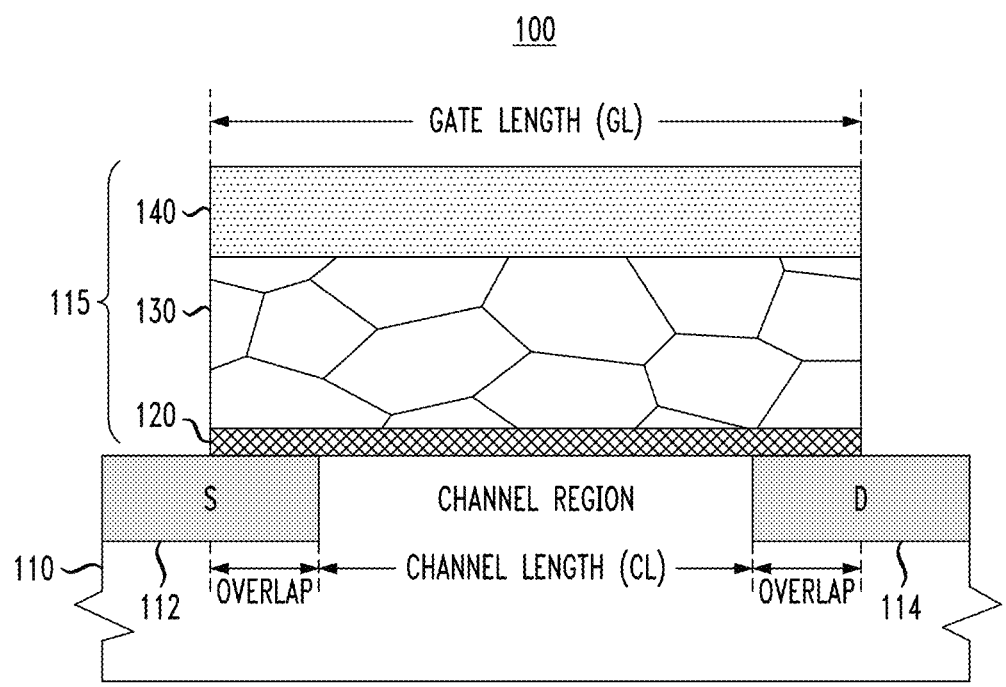
FIG. 1 is a schematic view of an FeFET device according to an exemplary embodiment of the disclosure.

FIG. 1 is a schematic view of an FeFET device 100 according to an exemplary embodiment of the disclosure. The FeFET device 100 comprises a substrate 110, a first source/drain region 112, a second source/drain region 114, and a gate structure 115. The gate structure 115 comprises an interfacial layer 120, a ferroelectric layer 130, and a gate electrode 140. The substrate 110 comprises a "channel region" disposed below the gate structure 115 between the first and second source/drain regions 112 and 114. The FeFET device 100 has a structure that is similar to a metal-oxide-semiconductor field-effect transistor (MOS-FET) device, with the exception that gate stack of the FeFET device 100 comprises the ferroelectric layer 130 disposed between the gate electrode 140 and the upper surface of the substrate 110. As explained in further detail below, the FeFET device 100 is structurally configured and programmable to allow the ferroelectric layer 130 to be polarized into a plurality of different polarization states to obtain different threshold voltages that define a multi-level FeFET device with at least 4 different states to store at least 2 bits of information.

The substrate 110 is formed of a semiconductor material such as silicon or other suitable semiconductor materials. The substrate 110 shown in FIG. 1 represents an active semiconductor layer of a semiconductor substrate. For instance, the substrate 110 can be, e.g., an upper surface of a bulk substrate, an active semiconductor layer of a semiconductor-on-insulator (SOI) substrate, a doped well that is formed in an upper surface of a semiconductor layer, etc. The substrate 110 can be doped to have a first conductivity type (e.g., N-type) or a second conductivity type (e.g., P-type). The first and second source/drain regions 112 and 114 are doped regions within the substrate 110 that have a conductivity type which is opposite to the conductivity type of the substrate 110. For example, for an N-type FeFET device, the substrate 110 comprises a P-type conductivity, while the first and second source/drain regions 112 and 114 each comprise an N-type conductivity (e.g., $N^+$ doping). For a P-type FeFET device, the substrate 110 comprises a N-type conductivity, while the first and second source/drain regions 112 and 114 each comprise a P-type conductivity (e.g., $P^+$ doping).

For illustrative purposes, exemplary non-limiting embodiments of the disclosure will be discussed in the context of N-type FeFET devices that operate in an enhancement mode. It is to be understood that the term "source/drain region" as used herein means that a given source/drain region can be either a source region or a drain region, depending on the application or circuit configuration. For illustrative purposes, the first source/drain region 112 is labeled as a source region, and the second source/drain region 114 is labeled as a drain region. In some embodiments, the substrate 110 (i.e., body) comprises a separate "body terminal" which allows appropriate bias voltages (e.g., ground voltage) to be applied to the substrate 110 during programming operations for writing data to the FeFET device 100, and reading operations for reading data from the FeFET device 100. For example, during reading operations, the bias voltage applied to the substrate 110 will be the same voltage as the source region 112, to ensure that there is zero voltage across the source/substrate junction, and eliminate the "body effect" in which threshold voltage ($V_T$) can change as a result of voltage difference between the source and the body of the FeFET device.

In some embodiments, the interfacial layer 120 comprises a thin layer of insulating material including, but not limited to, a silicon oxide material (e.g., silicon dioxide), a silicon nitride material (e.g., SiN, SiON), or other suitable types of insulating materials. The ferroelectric layer 130 comprises a ferroelectric material including, but not limited to, a polycrystalline alloyed film of hafnium oxide ($HfO_2$), zirconium oxide ($ZrO_2$), hafnium zirconium oxide ($HfZrO_2$), and other types of high-k dielectric materials (e.g., hafnium oxides doped with aluminum, silicon, or yttrium) which can be formed with a crystalline microstructure that exhibits ferroelectric properties (e.g., orthorhombic ferroelectric phase). The interfacial layer 120 is an optional layer that is utilized for various purposes such as, e.g., providing a buffer layer to enhance the quality of the interface between the surface of the substrate 110 and the ferroelectric layer 130, reducing an amount of charge traps, and preventing reaction between the different materials of the ferroelectric layer 130 and the substrate 110, etc. In some non-limiting embodiments, the ferroelectric layer 130 has a thickness in a range of about 2 nanometers (nm) to about 20 nm. In some embodiments, the ferroelectric layer 130 is formed directly on the surface of the silicon substrate 110 (e.g., highly-doped Si substrate).

The gate electrode 140 comprises a conductive material including, but not limited to, titanium (Ti), titanium nitride (TiN), titanium silicide (TiSi), tantalum nitride (TaN), tungsten (W), tungsten silicide (WSi), ruthenium (Ru), rhenium (Re), nickel (Ni), platinum (Pt), iridium (Ir), or other types of conductive materials that are suitable for the given application. In some embodiments, material of the gate electrode 140 is selected to achieve a given work-function that influences the coercive voltage of the ferroelectric layer 130 in a manner that enhances performance of the FeFET device 100 when used, for example, as a ferroelectric memory cell.

It is to be understood that FIG. 1 is a high-level schematic illustration of an FeFET device which presented for ease of illustration and discussion. The FeFET device 100 could include other elements such as, e.g., one or more insulating layers (e.g., gate sidewall spacers, gate capping layers, pre-metal dielectric (PMD) layers, etc.) encapsulating the gate structure 115, a gate contact formed in contact with the upper surface of the gate electrode 140, source/drain contacts formed in contact with the first and second source/drain regions 112 and 114, a body region formed in the substrate 110, and a body contact formed in contact with the body region, etc. In addition, the gate electrode 140 may comprise a multi-layer structure which comprises a first gate electrode layer (e.g., work function metal layer) formed on the ferroelectric layer 130, and a second gate electrode layer (e.g., low resistance metal layer) formed on the first gate electrode layer. In some embodiments, the channel region of the FeFET device 100 comprises a high channel doping concentration (e.g., $>1E19$ $cm^{-3}$). The high channel doping enhances the ability to determine a logic state of the FeFET device when performing a read operation (as discussed below in conjunction with FIGS. 3A-3E) to determine a logic state of the FeFET device 100 in which the FeFET device 100 is configured to operate in a saturation mode (with a pinched-off inversion channel) to generate a read current which used to determine a logic state of the FeFET device 100.

As noted above, the FeFET device 100 is structurally and ferroelectrically configured to allow the ferroelectric layer 130 to be polarized into a plurality of different polarization states to obtain a multi-level FeFET device. For example, the ferroelectric layer 130 is structurally configured to have a polycrystalline microstructure, as schematically illustrated in FIG. 1. In some embodiments, the polycrystalline microstructure comprises a mosaic of small crystallites (or grains) of varying size and randomly distributed with no preferred orientation (i.e., random texture and no grain direction). In some embodiments, various conditions and parameters of the fabrication process for the ferroelectric layer 130 can be selected such that the grains (or crystallites) of the ferroelectric layer 130 are grown to have a target alignment, resulting in a grain texture.

In some embodiments, a gate length (GL) of the gate structure 115 of the FeFET device 100 is at least two times (2X) than an average grain size of the polycrystalline microstructure of ferroelectric layer 130. It is to be understood that the term "average grain size" as used herein is a well-known term of art, which denotes a parameter that can be estimated using known techniques. For example, one technique for estimating the average grain size of a given material is known as the "intercept" method. With this method, a straight line of a given length (L) is drawn through a micrograph of the crystal structure of the given material (e.g., a TEM (Transmission Electron Microscope) or STEM (Scanning Transmission Electron Microscope) microstructure image). The number of grains (N) that the straight line intersects is counted. The average grain size is then determined as (L)/(N).

Furthermore, with regard to the ferroelectric properties of the ferroelectric layer 130, in some embodiments, the ferroelectric layer 130 is formed with multiple ferroelectric domains (e.g., region R1 and region R2 (FIGS. 2A-2D)). In the context of the exemplary embodiments described herein, the term "ferroelectric domain" refers to a region of the ferroelectric layer 130 within which a permanent oriented spontaneous polarization can be obtained by applying a coercive electric field (e.g., coercive voltage) to the given region. As noted above, a ferroelectric material can become spontaneously polarized in the presence of a coercive electric field. The permanent spontaneous polarization comprises a remnant polarization (or remnant polarization charges) which remains within the ferroelectric material, either positive or negative, after the coercive electric field is removed. The coercive electric field denotes a magnitude of an electric field which, if applied to the ferroelectric material, is sufficient to induce switching from a positive polarization charge to a negative polarization charge, and vice versa. In general, a coercive voltage is a function of the thickness of the ferroelectric film multiplied by the coercive field value.

In some embodiments, the ferroelectric layer 130 is structurally and ferroelectrically configured (using domain engineering techniques when forming the ferroelectric layer 130) to comprise at least two ferroelectric domains, wherein a first ferroelectric domain is disposed in a region (e.g., region R1) of the ferroelectric layer 130 adjacent the first source/drain region 112, and wherein a second ferroelectric domain is disposed in a region (e.g., region R2) of the ferroelectric layer 130 adjacent the second source/drain region 114. With domain engineering, the different regions (or ferroelectric domains) can be formed with a desired size. In some embodiments, the ferroelectric domains of the ferroelectric layer 130 have spontaneous polarizations with coercive electrical fields that are the same or substantially the same. In this regard, the polarization states of the ferroelectric domains in the different regions of the ferroelectric layer 130 can be controlled by the same (or substantially the same) coercive voltage. In other embodiments, the ferroelectric layer 130 is formed to have many ferroelectric domains that naturally arise by virtue of, e.g., the different grains or groups of grains within the polycrystalline structure of the ferroelectric layer 130.

Moreover, in some embodiments, the first and second source/drain regions 112 and 114 are formed to have a target amount of overlap with the gate structure 115 such that a channel length (CL) of the channel region between inner edges of the first and second source/drain regions 112 and 114 is less than the gate length (GL). The amount of overlap between the gate structure 115 and the first and second source/drain regions 112 and 114 should allow for a sufficient amount of electric field strength to exist between the gate structure 115 and the first and second source/drain regions 112 and 114 to program the polarization polarity in the different regions R1 and R2 of the ferroelectric layer 130 in response to programming voltages that are applied to the gate electrode 140 and the first and second source/drain regions 112 and 114 during programming operations (as discussed below) to write data (e.g., 2-bit data) to the FeFET device 100.

For example, in some embodiments, the amount of overlap between the gate structure 115 and each of the first and second source/drain regions 112 and 114 is on the order of at least one average grain size of the ferroelectric layer 130. In other embodiments, the amount of overlap between the gate structure 115 and each of the first and second source/drain regions 112 and 114 can be less than an average grain size of the ferroelectric layer 130 in circumstances where a totality of the electric fields, including the fringing electrical fields between the inner edges of the first and second source/drain regions 112 and 114 and the gate structure 115, would be sufficient to program the polarization in the different regions R1 and R2 of the ferroelectric layer 130.

In other embodiments, there is no overlap between the gate structure 115 and the first and second source/drain regions 112 and 114. More specifically, in some embodiments, the inner edges of the first and second source/drain regions 112 and 114 are substantially aligned with sidewalls of the gate structure 115 such that the gate length (GL) is the same or substantially the same as the channel length (CL). The FeFET device 100 can have such a "non-overlapping" structural configuration in circumstances where the fringing electrical fields between the first source/drain region 112 and the first region R1 of the ferroelectric layer 130 would be sufficient to switch (and thereby program) the polarization polarity in the first region R1, and where the fringing electrical fields between the second source/drain region 114 and the second region R2 of the ferroelectric layer 130 would be sufficient to switch (and thereby program) the polarization polarity in the second region R2. In this regard, it is to be understood that the term "adjacent" as used in the context of the relative position of the first and second source/drain regions 112 and 114 and the gate structure 115 should be broadly constructed to include overlapping and non-overlapping structural configurations.

Furthermore, with regard to the ferroelectric properties of the ferroelectric layer 130, in some embodiments, the ferroelectric layer 130 is formed to have multiple ferroelectric domains (e.g., region R1 and region R2 (FIGS. 2A-2D)). In the context of the exemplary embodiment described herein, the term "ferroelectric domain" refers to a region of the ferroelectric layer 130 within which a permanent oriented spontaneous polarization can be obtained by applying a coercive electric field (e.g., coercive voltage) to the given region. As noted above, a ferroelectric material can become spontaneously polarized in the presence of a coercive electric field. The permanent spontaneous polarization comprises a remnant polarization (or remnant polarization charges) which remains within the ferroelectric material, either positive or negative, after the coercive electric field is removed. The coercive electric field denotes a magnitude of an electric field which, if applied to the ferroelectric material, is sufficient to induce switching from a positive polarization charge to a negative polarization charge, and vice versa. In general, a coercive voltage is a function of the thickness of the ferroelectric film multiplied by the coercive field value.

In some embodiments, the ferroelectric layer 130 is structurally and ferroelectrically configured to comprise at least two ferroelectric domains, wherein a first ferroelectric domain is disposed in a region (e.g., region R1) of the ferroelectric layer 130 adjacent the source region 112, and wherein a second ferroelectric domain is disposed in a region (e.g., region R2) of the ferroelectric layer 130 adjacent the drain region 114. In some embodiments, the ferroelectric domains of the ferroelectric layer 130 have spontaneous polarizations with coercive electrical fields that are the same or substantially the same. In this regard, the polarization states of the ferroelectric domains in the different regions of the ferroelectric layer 130 can be controlled by the same (or substantially the same) coercive voltage.

FIGS. 2A, 2B, 2C and 2D schematically illustrate different polarization states of an FeFET device to implement a multi-level FeFET device, according to an exemplary embodiment of the disclosure. In particular, FIGS. 2A-2D schematically illustrate different polarization states (200-1, 200-2, 200-3, 200-4) of the ferroelectric layer 130 of the FeFET device 100 of FIG. 1, wherein each polarization state corresponds to a different threshold voltage of the FeFET device 100 to implement a multi-level FeFET device. In some embodiments, the FeFET device 100 is structurally and electrically configured to have at least four different polarization states which correspond to at least four different threshold voltages, to thereby obtain at least four binary logic states (e.g., store at least 2 bits of information) which are encoded in the different threshold voltages of the FeFET device 100. In the exemplary embodiments of FIGS. 2A, 2B, 2C and 2D, it is assumed that the FeFET device 100 comprises an N-type FeFET. The threshold voltage $V_T$ denotes a minimum gate-to-source voltage ($V_{GS}$) that is needed to create a conducting path (inversion channel) in the channel region between the source region 112 and the drain region 114.

More specifically, FIG. 2A schematically illustrates a first polarization state 200-1 in which all regions R1 and R2 (e.g., ferroelectric domains), of the ferroelectric layer 130 have a remnant polarization with a "first polarity" (e.g., a net negative ferroelectric polarization) where the electric dipoles across the ferroelectric layer 130 are oriented with the positive poles directed to the gate electrode 140 and the negative poles directed to the channel region of the substrate 110. The first polarization state 200-1 shown in FIG. 2A presents a net negative charge to the upper surface of the substrate 110 in the channel region, thereby causing positive (majority) charge carriers from the substrate 110 to accumulate at the surface of the substrate 110 in the channel region. The net effect of the first polarization state 200-1 is an increase in the threshold voltage of the FeFET device 100 such that the FeFET device 100 has a first threshold voltage $V_T1$. In some embodiments, the first threshold voltage $V_T1$ of the FeFET device 100 represents a binary logic state of (0,0).

Next, FIG. 2B schematically illustrates a second polarization state 200-2 in which all regions R1 and R2 of the ferroelectric layer 130 have a remnant polarization with a "second polarity" (e.g., a net positive ferroelectric polarization) where the electric dipoles across the ferroelectric layer 130 are oriented with the negative poles directed to the gate electrode 140 and the positive poles directed to the channel region of the substrate 110. The second polarization state 200-2 shown in FIG. 2B presents a net positive charge to the upper surface of the substrate 110 in the channel region, thereby causing negative (minority) charge carriers from the substrate 110 to accumulate (and invert the channel region) at the surface of the substrate 110 in the channel region. This results in the formation of an N-type inversion channel in the upper surface of the P-type substrate 110 in the channel region, which exists during a state of equilibrium (when no gate, drain, or source voltages are applied to the FeFET device 100). The net effect of the second polarization state 200-2 is a decrease in the threshold voltage of the FeFET device 100 (relative to the first threshold voltage $V_T1$) such that the FeFET device 100 has a second threshold voltage $V_T2$, wherein $V_T1 > V_T2$. In some embodiments, the second threshold voltage $V_T2$ of the FeFET device 100 represents a binary logic state of (1,1).

Next, FIG. 2C schematically illustrates a third polarization state 200-3 (e.g., partial polarization state) in which the first region R1 of the ferroelectric layer 130 (adjacent the source region 112) has a remnant polarization with the first polarity (net negative ferroelectric polarization), and the second region R2 of the ferroelectric layer 130 (adjacent the drain region 114) has a remnant polarization with the second polarity (net positive ferroelectric polarization). In this exemplary embodiment, the negative ferroelectric polarization in the first region R1 of the ferroelectric layer 130 presents a net negative charge to a portion of the channel region adjacent the source region 112, thereby causing positive (majority) charge carriers from the substrate 110 to accumulate at the surface of the substrate 110 in the portion of the channel region adjacent to the source region 112 and aligned to the first region R1. In addition, the positive ferroelectric polarization in the second region R2 of the ferroelectric layer 130 presents a net positive charge to a portion of the channel region adjacent the drain region 114, thereby causing negative (minority) charge carriers to accumulate at the surface of the substrate 110 in the portion of the channel region adjacent to the drain region 114 and aligned to the second region R2.

The net effect of the third polarization state 200-3 is that the regions R1 and R2 have different threshold voltages, $V_{T\_}R1$ and $V_{T\_}R2$, respectively, wherein $V_{T\_}R1$ is the same or substantially the same as $V_T1$, and wherein $V_{T\_}R2$ is the same or substantially the same as $V_T2$. In this instance, the net effect of the third polarization state 200-3 is that the FeFET device 100 has an "effective" third threshold voltage $V_T3$ which is based on the variation of the charge distribution along the channel region due to the different threshold voltages $V_{T\_}R1$ and $V_{T\_}R2$. As explained in further detail below, the "effective" third threshold voltage $V_T3$ is based primarily on the polarization polarity (first polarity) in the first region R1 which is aligned to a pinched-off inversion channel 150-3 that is created when the FeFET device 100 is operated in a saturation mode to read the state of the FeFET device 100. In this instance, the third polarization state 200-3 results in a decrease in the threshold voltage of the FeFET device 100 (relative to the first threshold voltage $V_T1$) such that the effective third threshold voltage $V_T3$ has a value that is between $V_T1$ and $V_T2$, wherein $V_T1 > V_T3 > V_T2$. In some embodiments, the effective third threshold voltage $V_T3$ of the FeFET device 100 represents a binary logic state of (0,1).

Next, FIG. 2D schematically illustrates a fourth polarization state 200-4 (e.g., partial polarization state) in which the first region R1 of the ferroelectric layer 130 (adjacent the source region 112) has a remnant polarization with the second polarity (net positive ferroelectric polarization), and the second region R2 of the ferroelectric layer 130 (adjacent the drain region 114) has a remnant polarization with the first polarity (net negative ferroelectric polarization). In this exemplary embodiment, the positive ferroelectric polarization in the first region R1 of the ferroelectric layer 130 presents a net positive charge to a portion of the channel region adjacent the source region 112, thereby causing negative (minority) charge carriers from the substrate 110 to accumulate at the surface of the substrate 110 in the portion of the channel region adjacent to the source region 112 and aligned to the first region R1. In addition, the negative ferroelectric polarization in the second region R2 of the ferroelectric layer 130 presents a net negative charge to a portion of the channel region adjacent the drain region 114, thereby causing positive (majority) charge carriers to accumulate at the surface of the substrate 110 in the portion of the channel region adjacent to the drain region 114 and aligned to the second region R2.

The net effect of the fourth polarization state 200-4 is that the regions R1 and R2 have different threshold voltages, $V_T\_R1$ and $V_T\_R2$, respectively, wherein $V_T\_R1$ is the same or substantially the same as $V_T2$, and wherein $V_T\_R2$ is the same or substantially the same as $V_T1$. In this instance, the net effect of the fourth polarization state 200-4 is that the FeFET device 100 has an "effective" fourth threshold voltage $V_T4$ which is based on the variation of the charge distribution along the channel region due to the different threshold voltages $V_T\_R1$ and $V_T\_R2$. As explained in further detail below, the "effective" fourth threshold voltage $V_T4$ is based primarily on the polarization polarity (second polarity) in the first region R1 which is aligned to a pinched-off inversion channel 150-4 that is created when the FeFET device 100 is operated in a saturation mode to read the state of the FeFET device 100. In this instance, the fourth polarization state 200-4 results in a decrease in the threshold voltage of the FeFET device 100 (relative to the first threshold voltage $V_T1$ and the effective third threshold voltage $V_T3$) such that the effective fourth threshold voltage $V_T4$ has a value that is between $V_T2$ and $V_T3$, wherein $V_T1 > V_T3 > V_T4 > V_T2$. In some embodiments, the effective fourth threshold voltage $V_T4$ of the FeFET device 100 represents a binary logic state of (1,0).

In the exemplary embodiments of FIGS. 2A-2D, the first and second threshold voltages $V_T1$ and $V_T2$ define the largest "memory window" (MW) of the FeFET device 100 (i.e., $MW = V_T1 - V_T2$) wherein $V_T1$ represents the largest threshold voltage and $V_T2$ represents the smallest threshold voltage of the FeFET device 100. The exemplary embodiments of FIGS. 2A and 2B illustrate "fully polarized states" of the FeFET device 100 (or full polarization states) in which the entirety of the ferroelectric layer 130 of the FeFET device 100 has a net positive polarization polarity or a net negative polarization polarity. On the other hand, the effective threshold voltages $V_T3$ and $V_T4$ have values that fall in a range between the threshold voltages $V_T1$ and $V_T2$, such that $V_T3 > V_T4$, and such that $V_T1 > V_T3 > V_T4 > V_T2$. The exemplary embodiments of FIGS. 2C and 2D illustrate "partially polarized states" of the FeFET device 100 (or partial polarization states) in which the different regions R1 and R2 of the ferroelectric layer 130 of the FeFET device 100 have different net polarization polarities (e.g., net positive polarization polarity or a net negative polarization polarity). In this regard, the modulation of the threshold voltage of the FeFET device 100 is achieved by the polarity of the ferroelectric polarization distribution along the channel region. The different polarization states shown in FIGS. 2A-2D are obtained by performing programming operations as will be discussed in further detail below.

In some embodiments, the binary logic state (e.g., (0,0), (0,1), (1,0), or (1,1)) of the FeFET device 100 is determined by performing a read operation which involves applying a first voltage (VG_Read) to the gate terminal, applying a second voltage (VD_Read) to the drain terminal, and grounding the source and substrate body terminals, and sensing a resulting drain current ($I_D$) as a "read current." In some embodiments, the sensed drain current is compared to a plurality of different reference current levels, which correspond to respective ones of the different polarization states of the FeFET device 100, to determine the binary logic state (e.g., (0,0), (0,1), (1,0), or (1,1)) of the FeFET device 100.

In some embodiments, the read operations are performed with the FeFET device 100 operating in a "saturation mode" where there is a "pinch off" of an inversion channel in the channel region. For example, FIGS. 2A, 2B, 2C, and 2D schematically illustrate conditions in which the FeFET device 100 is operating in a saturation mode (during a read operation) with respective "pinched off" inversion channels 150-1, 150-2, 150-3, and 150-4 (more generally, inversion channel 150) formed in the channel region between the source region 112 and the drain region 114. The "pinched-off" inversion channels 150-1, 150-2, 150-3, and 150-4 are schematically shown to extend from the source region 112 with a length that is less than the channel length CL, thereby resulting in a "pinch off region" between the end of the inversion channel 150 and the drain region 114. As schematically illustrated in FIGS. 2A, 2B, 2C, and 2D, the respective "pinched off" inversion channels 150-1, 150-2, 150-3, and 150-4 have different sizes (e.g., different lengths), which results in "pinch off regions" with the channel region having different lengths PL1, PL2, PL3, and PL4, respectively, wherein PL1 > PL3 > PL4 > PL2.

In this manner, when performing read operations, the threshold voltage $V_T$ (e.g., $V_T1$, $V_T2$, $V_T3$, or $V_T4$) of the FeFET device 100 is modulated based, at least in part on, the polarization polarity of the region (e.g., region R1) of the ferroelectric layer 130 which is aligned with the "pinched-off" inversion channel 150 adjacent to the source region 112. This modulation in the threshold voltage is particularly relevant for the polarization states as schematically shown in FIGS. 2C and 2D, where the polarization distribution in the different regions (e.g., regions R1 and R2) of the ferroelectric layer 130 along the channel region has a significant influence on the effective threshold voltages $V_T3$ and $V_T4$ of the FeFET device 100 (and thus the level of the drain current that is generated during the read operation in saturation mode) depending on, e.g., the polarities of the regions (e.g., R1 and R2) of the ferroelectric layer 130, which are aligned to, and not aligned to, the "pinched-off" inversion channel 150.

For example, as schematically illustrated in FIGS. 2C and 2D, operating the FeFET device 100 in a saturation mode during a read operation results in a substantial alignment or overlapping of the respective "pinched-off" inversion channels 150-3 and 150-4 with the first region R1 of the ferroelectric layer 130 (adjacent the source region 112). In this regard, the difference in the effective third and fourth threshold voltages $V_T3$ and $V_T4$ of the FeFET device 100 for the different polarization states 200-3 and 200-4 (e.g., between logic states (0,1) and (1,0)) as shown in FIGS. 2C and 2D, will be more pronounced (more modulated) depending on the polarization polarity of the region R1 of the ferroelectric layer 130 that is substantially aligned to or otherwise overlaps the respective "pinched-off" inversion channel 150-3 and 150-4, as compared to the polarization polarity of the second region R2 of the ferroelectric layer 130 adjacent the drain region 114 which is not substantially aligned to the respective "pinched-off" inversion channels 150-3 and 150-4. If the FeFET device 100 is not operated in saturation mode during the read operation, there would be less of a difference (or no difference) in the effective third and fourth threshold voltages $V_T3$ and $V_T4$ of the FeFET device 100 between the different polarization states 200-3 and 200-4, irrespective of the different polarization polarities of the regions R1 and R2 alone.

For example, if the FeFET device 100 is operated in a triode (linear) region during a read operation, a resulting inversion channel would extend along the entire channel length (CL) of the channel region (no pinch off), such the entire inversion channel would be modulated by the polarization in the regions R1 and R2 of the ferroelectric layer 130. In this instance, despite the different polarization polarities of the regions R1 and R2 as schematically shown in FIGS. 2C and 2D, both polarization states 200-3 and 200-4 would have a similar modulating effect on the entire inversion channel, thus, reducing the level of differentiation between the effective threshold voltages $V_T3$ and $V_T4$ of the FeFET device 100 for the different polarization states 200-3 and 200-4. On the other hand, as noted above, when operating the FeFET device 100 in the saturation mode where pinch-off occurs, the different polarization states 200-3 and 200-4 will play different roles in modulating the respective inversion channels 150-3 and 150-4 such that the FeFET device 100 would exhibit a greater difference and discernibility in the effective threshold voltages $V_T3$ and $V_T4$ for the respective polarization states 200-3 and 200-4 (e.g., logic states (0,1) and (1,0)).

Figure 3A:
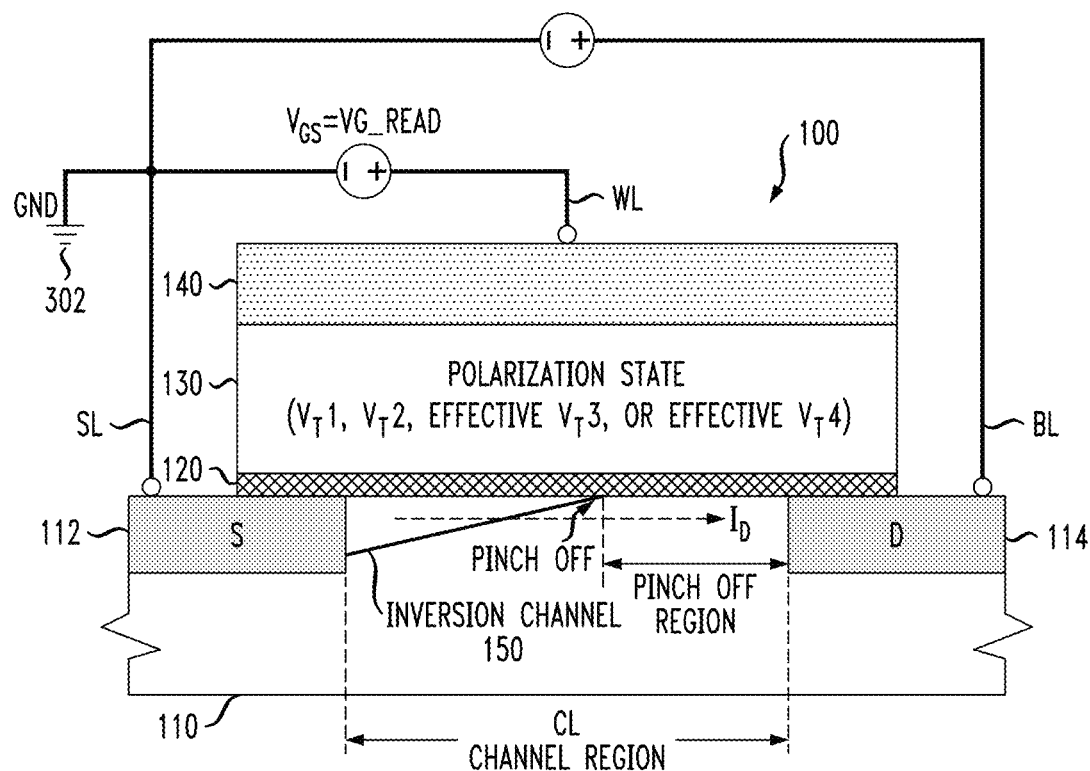
FIGS. 3A, 3B, and 3C schematically illustrate a method for performing a read operation to determine a state of a multi-level FeFET device, according to an exemplary embodiment of the disclosure.
Figures 3B, 3C:
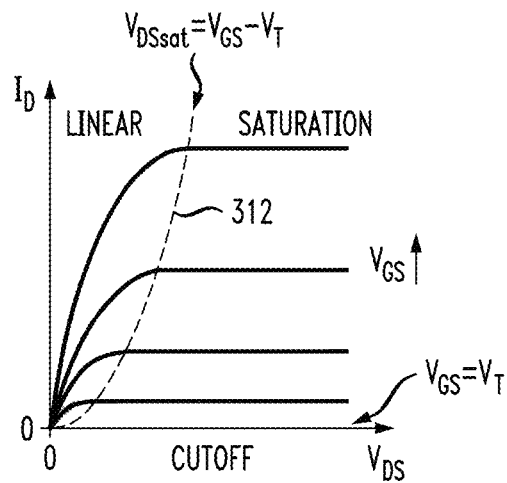

FIGS. 3A, 3B, and 3C schematically illustrate a method for performing a read operation to determine a state of a multi-level FeFET device, according to an exemplary embodiment of the disclosure. In particular, FIGS. 3A-3C illustrate methods for reading data (e.g., 2 bits of data) from a multi-level FeFET device. In some embodiments, FIG. 3A schematically illustrates a read operation 300 that is performed for the N-type FeFET device 100, which can have any one of the polarization states and associated threshold voltages (e.g., $V_T1$, $V_T2$, $V_T3$, or $V_T4$) shown in FIGS. 2A-2D. For illustrative purposes, it is assumed that the N-type FeFET device 100 is implemented in a single transistor (1T) memory cell architecture in which the FeFET device 100 operates as both an access (select) transistor and a storage element of a non-volatile memory cell that is included in an array of non-volatile memory cells of a memory device (e.g., FIG. 6). In the exemplary configuration shown in FIG. 3A, the gate electrode 140 is connected to a word line (WL), the drain region 114 is connected to a bit line (BL), and the source region 112 is connected to a source line (SL), wherein the source line (SL) is connected to ground GND 302 (e.g., V=0). In addition, although not specifically shown in FIG. 3A, it is assumed a body terminal (or well terminal) of the substrate 110 is connected to ground GND 302. Moreover, for purposes of discussion, as shown in FIG. 3A, it is assumed that the drain current $I_D$ (minority carriers) in the channel region of the FeFET device 100 flows from the source region 112 to the drain region 114.

As noted above, in some embodiments, a read operation is performed by applying a first voltage VG_Read to the word line and applying a second voltage VD_Read to the bit line BL. The first voltage VG_Read (or gate-to-source/substrate voltage ($V_{GS}$)) has a magnitude which greater than the largest possible threshold voltage $V_T$ (e.g., $V_T1$) of the programmed FeFET device 100 to ensure that the FeFET device 100 will be "turned on" for all logic states (which are encoded in the threshold voltages) of the FeFET device 100. In addition, to ensure that the read operation does not result in changing the logic state of the FeFET device 100, the magnitude of the first voltage VG_Read should be less than the magnitude of the "coercive voltage" for switching the polarization states of the ferroelectric domains within the ferroelectric layer 130 of the FeFET device 100.

Moreover, the second voltage VD_Read (or drain-to-source voltage ($V_{DS}$)) has a magnitude that is selected to ensure that, during a read operation, the FeFET device 100 operates in a saturation mode for all threshold voltages (e.g., $V_T1$, $V_T2$, effective $V_T3$, or effective $V_T4$). As is known in the art, a MOSFET device will be in a saturation mode of operation when $V_{GS} > V_T$ and $V_{DS} \geq (V_{GS} - V_T)$. In some embodiments, the magnitude of VD_Read is selected based on the logic state which corresponds to the lowest threshold voltage, e.g., $V_T2$ (FIG. 2B), of the FeFET device 100. More specifically, during a read operation, the FeFET device 100 will operate in the saturation mode for all logic states when the magnitude of the second voltage VD_Read is set to a level where VD_Read>(VG_Read−$V_T2$). In this manner, during a read operation, the FeFET device 100 is operating in a saturation mode for all the possible polarization states, or threshold voltages $V_T1$, $V_T2$, $V_T3$, and $V_T4$, of the FeFET device 100.

For illustrative purposes, FIG. 3B graphically illustrates a plurality of curves 310 that represent MOSFET drain current ($I_D$) vs. drain-to-source voltage ($V_{DS}$) for increasing values of gate-to-source/substrate ($V_{GS}$) voltages (starting with $V_{GS}=V_T$), which is applicable for explaining a saturation mode of operation of the exemplary N-type FeFET device 100. When $V_{GS}<V_T$ (where $V_T=V_T1$, $V_T2$, $V_T3$, or $V_T4$), the FeFET device 100 will be in a "cut off" or "subthreshold" mode, where no drain current $I_D$ flows from the source region 112 to the drain region 114. As shown in FIG. 3B, the FeFET device 100 will be in a "linear region" or "ohmic mode" when $V_{GS}>V_T$ and $V_{DS}<V_{GS}-V_T$. In the linear region, an inversion channel is created in the channel region between the source and drain regions 112 and 114, where the drain current $I_D$ increases with an increase in $V_{DS}$. As further shown in FIG. 3B, the FeFET device 100 will be in a "saturation region" or "active mode" when $V_{GS}>V_T$ and $V_{DS}>(V_{GS}-V_T)$. The boundary between the linear region and the saturation region is depicted in FIG. 3B by an upward curving parabola 312. The different $V_{GS}$ curves intersect the boundary curve 312 at each point where $V_{DS}=(V_{GS}-V_T)$. In the saturation mode, for a given $V_{GS}$ and $V_T$, the drain current $I_D$ remains substantially constant, independent of $V_{DS}$.

In the linear region, the inversion channel 150 extends across the entire channel length (CL) of the channel region between the source and drain regions 112 and 114. When the FeFET device 100 first enters the saturation region $V_{DS}=(V_{GS}-V_T)$, the inversion channel 150 exhibits tapering and channel pinching adjacent the drain region 114. However, as $V_{DS}$ increases (e.g., $V_{DS}>(V_{GS}-V_T)$, the length of the inversion channel 150 shortens (known as channel length modulation (CLM)), creating a "pinch off region" between the end of the inversion channel 150 and the drain region 114, as schematically shown in FIG. 3A, wherein the "pinch off region" comprises a depletion region with un-inverted semiconductor material (e.g., un-inverted silicon).

When the FeFET device 100 is turned on $V_{GS}>V_T$, charge accumulates in and across the channel region (creating an inversion channel) due to the gate-to-source/substrate voltage (assuming the substrate 110 and the source region 112 are connected to the same potential). When $V_{DS}$ is applied, the induced charge density of the inversion channel will vary along the channel region. When $V_{DS}$ reaches a level of $V_{DS\_sat}=V_{GS}-V_T$, the effective gate-to-substrate voltage ($V_{EFF}$) adjacent the drain region 114 will be $V_{EFF}=V_{GS}-V_{DS\_sat}=V_T$, which is just enough to form the inversion channel layer 150 adjacent the drain region 114 (with the beginning of the "pinch off" of the inversion channel 150). When voltage applied to drain region 114 increases beyond $V_{DS\_sat}$, the gate-to-substrate voltage near the drain region 114 will reduce below $V_T$, resulting in the creation of the pinch-off region where the inversion channel will not be formed. In the pinch off region, the gate-to-substrate voltage is insufficient to form the inversion layer and thus, the pinch off region becomes a depleted region which lacks mobile minority carriers. However, the minority charge carriers that enter the pinch off region from the inversion channel 150 will be accelerated across the pinch off region to the drain region 114 by the voltage potential ($V_{DS}$) across the pinch off region.

As noted above, the process of operating of the FeFET device 100 in a saturation mode during a read operation allows for more modulation and differentiation between the different threshold voltages of the FeFET device 100 based on, e.g., the polarity of the remnant polarization in the region (e.g., R1) of the ferroelectric layer 130 which is substantially aligned to the shortened inversion channel 150 adjacent the source region 112. In particular, as explained above, the modulation and differentiation between the threshold voltages of the FeFET device 100 is more significant in the partial polarization states of the FeFET device 100 as shown in FIGS. 2C and 2D, wherein the polarity of the remnant polarization in the first region R1 of the ferroelectric layer 130 (which is substantially aligned to the "pinched-off" inversion channel 150) adjacent the source region 112, provides a greater modulating effect on, and differentiation between, the magnitudes of the effective threshold voltages $V_T3$ and $V_T4$, respectively, as compared to the minimal modulating effect that the polarities of the remnant polarizations in the second region R2 of the ferroelectric layer 130 (which are substantially aligned to the pinch off regions) adjacent the drain region 114 have on the effective threshold voltages $V_T3$ and $V_T4$. In other words, while the polarity of the remnant polarization in the second region R2 of the ferroelectric layer 130 adjacent the drain region 114 would have some modulating effect on the threshold voltage $V_T$ of the FeFET device 100, the polarity of the remnant polarization in the first region R1 of the ferroelectric layer 130 adjacent the source region 112 has a greater modulating effect on the threshold voltage $V_T$ of the FeFET device 100 in instances where the read operations are performed with the FeFET device 100 in a saturation mode.

FIG. 3C includes a table 320 which illustrates operating conditions and parameters associated with performing a read operation of a multi-level FeFET device, according to an exemplary embodiment of the disclosure. More specifically, FIG. 3C shows (i) different threshold voltages $V_T1$, $V_T2$, effective $V_T3$, and effective $V_T4$ which are correlated to the different polarization states of the FeFET device 100 as shown in FIGS. 2A-2D, (ii) different reference currents $I_D1$, $I_D2$, $I_D3$, and $I_D4$ which are correlated to the respective threshold voltages $V_T1$, $V_T2$, effective $V_T3$, and effective $V_T4$, and (iii) logic binary states (0,0), (1,1), (0,1), and (1,0) that are encoded in the respective threshold voltages $V_T1$, $V_T2$, effective $V_T3$, and effective $V_T4$ of the FeFET device 100. In some embodiments, the reference currents $I_D1$, $I_D2$, $I_D3$, and $I_D4$ represent the expected drain currents $I_D$ that will be generated by the FeFET device 100 based on the different threshold voltages $V_T1$, $V_T2$, effective $V_T3$, and effective $V_T4$, when FeFET device 100 is operated in saturation mode during a read operation with a fixed VG_Read applied to the gate/WL, a fixed VD_Read applied to the drain/BL, and with the source/substrate connected to ground (0V).

In some embodiments, during a read operation, the logic state of the FeFET device 100 will be determined by sensing the drain current $I_D$ that is generated by the FeFET device 100 when operating in saturation mode, and then comparing the sensed drain current $I_D$ to each of the reference currents $I_D1$, $I_D2$, $I_D3$, and $I_D4$ to determine the logic state associated with the sensed current $I_D$. The comparing process can be implemented using known techniques, e.g., implementing current mode sense amplifiers, and other known methods. The comparison is performed so that the sensed current $I_D$ will be deemed to match a given reference current $I_D1$, $I_D2$, $I_D3$, or $I_D4$ if the magnitude of the sensed current $I_D$ is determined to be the same or similar (within a given margin) to the magnitude of the given reference current.

In an exemplary embodiment where $V_T1$>effective $V_T3$>effective $V_T4$>$V_T2$, the magnitudes of reference currents would differ by $I_D2$>$I_D4$>$I_D3$>$I_D1$. The magnitudes of the different reference currents represent the expected magnitudes of the drain currents $I_D$ that are generated during a read operation as a result of the respective different polarization states (FIGS. 2A-2D) of the FeFET device 100, when the FeFET device 100 is operated in a saturation mode during the read operation. There can be instances (e.g., system noise, or variation in amount of partial polarization in the different regions R1 and R2 due to programming, etc.) where there is insufficient margin or distinction between the different effective threshold voltages $V_T3$ and $V_T4$ to sufficiently distinguish between different partial polarization states of the FeFET device 100 (e.g., the different partial polarization states 200-3 and 200-4 as shown in FIGS. 2C and 2D) by sensing the drain current $I_D$ that is generated as a result of performing a single read operation with the FeFET device 100 in saturation mode.

In such instances, in other embodiments, the partial polarization state (or the binary logic state) of an FeFET device is determined by reading the different threshold voltages (e.g., $V_{T\_}R1$ and $V_{T\_}R2$) that are present in the first and second regions R1 and R2 of the multi-level FeFET device by performing two read operations with opposite polarities a read voltage applied to the first and second source/drain regions 112 and 114. For example, to read the partial polarization state of the FeFET device 100, a first read operation (first read polarity) is performed with the FeFET device 100 in saturation mode to sense a first drain current $I_{D\_}R1$ that is generated with the pinched-off inversion channel substantially aligned to the first region R1 (which has the threshold voltage $V_{T\_}R1$). A second read operation (second read polarity) is performed with the FeFET device 100 in saturation mode to sense a second drain current $I_{D\_}R2$ that is generated with the pinched-off inversion channel substantially aligned to the second region R2 (which has the threshold voltage $V_{T\_}R1$). The magnitudes of the first and second drain currents $I_{D\_}R1$ and $I_{D\_}R2$ are compared. When the magnitude of the first drain current $I_{D\_}R1$ is determined to be less than the magnitude of the second drain current ($I_{D\_}R1$<$I_{D\_}R2$), it can be determined that $V_{T\_}R1$>$V_{T\_}R2$, and that the FeFET device 100 has the partial polarization state 200-3 as shown in FIG. 2C. On the other hand, when the magnitude of the first drain current $I_D\_R1$ is determined to be greater than the magnitude of the second drain current ($I_D\_R1 > I_D\_R2$), it can be determined that $V_T\_R1 < V_T\_R2$, and that the FeFET device 100 has the partial polarization state 200-4 as shown in FIG. 2D.

Figure 3D:
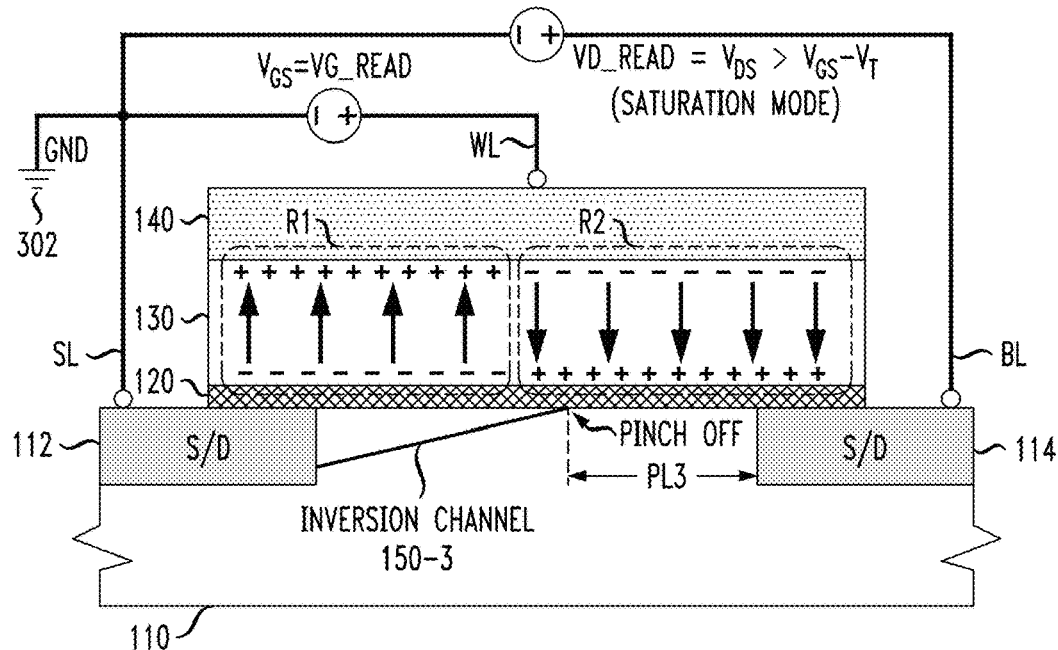
FIGS. 3D and 3E schematically illustrate a method for performing a read operation to determine a state of a multi-level FeFET device, according to another exemplary embodiment of the disclosure.
Figure 3E:
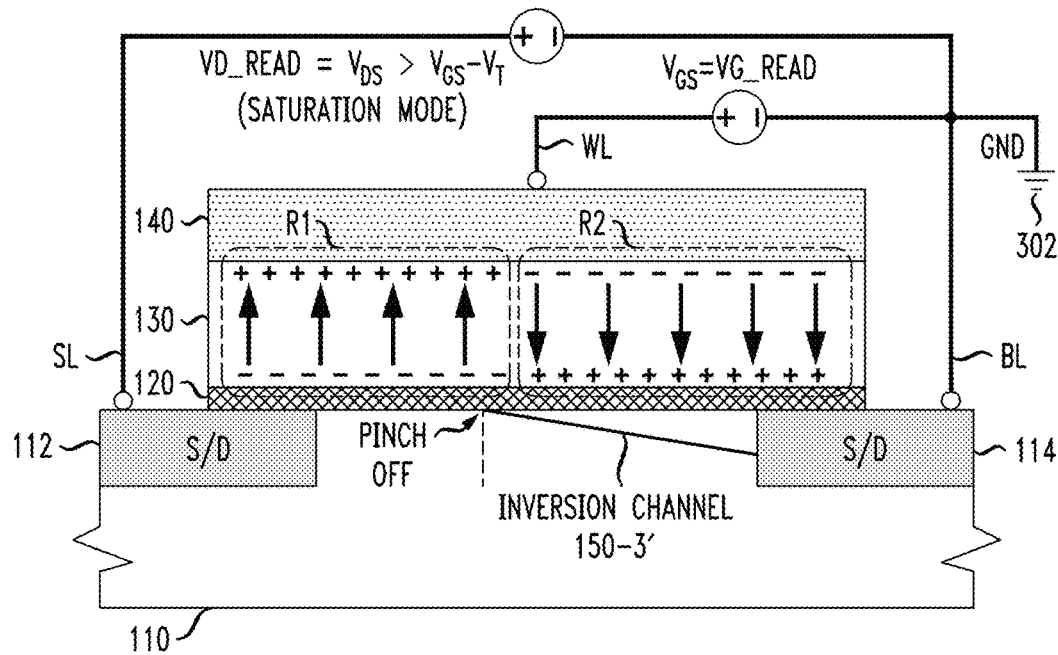

For example, FIGS. 3D and 3E schematically illustrate a method for performing a read operation to determine a state of a multi-level FeFET device, according to another exemplary embodiment of the disclosure. For purposes of illustration, FIGS. 3D and 3E schematically illustrate method for performing a read operation to determine the third polarization state 200-3 (e.g., partial polarization state) of the FeFET device shown in FIG. 2C, in which the first region R1 of the ferroelectric layer 130 (adjacent the first source/drain region 112) has a remnant polarization with the first polarity (e.g., net negative ferroelectric polarization), and the second region R2 of the ferroelectric layer 130 (adjacent the second source/drain region 114) has a remnant polarization with the second polarity (e.g., net positive ferroelectric polarization). With the partial polarization state 200-3, it is assumed that the first region R1 has a threshold voltage $V_T\_R1$ which corresponds to the first polarity of the remnant polarization in the first region R1, and that the second region R2 has threshold voltage $V_T\_R2$ which corresponds to the second polarity of the remnant polarization in the second region, where $V_T\_R1 > V_T\_R2$.

To read the partial polarization state of the FeFET device 100, a first read operation (first read polarity) is performed with the FeFET device 100 in saturation mode to sense a first drain current $I_D\_R1$ that is generated with a pinched-off inversion channel substantially aligned to the first region R1 (which has the threshold voltage $V_T\_R1$). For instance, as shown in FIG. 3D, in the first read configuration, the first source/drain region 112 is configured as a source region (connected to the source line SL) and the second source/drain region 114 is configured as a drain region (connected to the bit line BL), wherein a positive voltage VG_Read is applied to the word line WL with the source line SL connected to ground voltage GND (such that a positive $V_{GS}$ is applied across the gate electrode 140 and the first source/drain region 112), and a positive voltage VD_Read is applied to the bit line BL (such that a positive voltage $V_{DS}$ is applied to the second source/drain region 114 with the first source/drain region 112 connected to ground voltage GND). With the first read configuration shown in FIG. 3D, the read operation will generate a read current $I_D\_R1$ based, primarily on, the threshold voltage $V_T\_R1$ of the first region R1 aligned to the resulting pinched-off inversion channel 150-3 which extends from the first source/drain region 112.

Next, a second read operation (second read polarity) is performed with the FeFET device 100 in saturation mode to sense a second drain current $I_D\_R2$ that is generated with a pinched-off inversion channel substantially aligned to the second region R2 (which has the threshold voltage $V_T\_R2$). For instance, as shown in FIG. 3E, in the second read configuration, the first source/drain region 112 is configured as a drain region (connected to the source line SL) and the second source/drain region 114 is configured as a source region (connected to the bit line BL), wherein a positive voltage VG_Read is applied to the word line WL with the bit line BL connected to ground voltage GND (such that a positive $V_{GS}$ is applied across the gate electrode 140 and the second source/drain region 114), and a positive voltage VD_Read is applied to the source line SL (such that a positive voltage $V_{DS}$ is applied to the first source/drain region 112 with the second source/drain region 114 connected to ground voltage GND). With the second read configuration shown in FIG. 3E, the read operation will generate a read current $I_D\_R2$ based, primarily on, the threshold voltage $V_T\_R2$ of the second region R2 aligned to the resulting pinched-off inversion channel 150-3' which extends from second source/drain region 114.

With the exemplary read operation shown in FIGS. 3D and 3E, since the FeFET device 100 has the partial polarization state 200-3 where threshold voltage $V_T\_R1$ of the first region R1 is greater than the threshold voltage $V_T\_R2$ of the second region R2, the read current $I_D\_R1$ generated by the first read operation will be less than the read current $I_D\_R2$ generated by the second read operation. Given that $I_D\_R1 < I_D\_R2$, it can be determined that $V_T\_R1 > V_T\_R2$, and that the FeFET device 100 has the partial polarization state 200-3 as shown in FIG. 2C.

It is to be understood that a dual read operation as shown in FIGS. 3D and 3E is not needed when the FeFET device 100 has a partial polarization state (e.g., 200-3 or 200-4) as shown in FIGS. 2C and 2D in instances where the first read operation (read configuration of FIG. 3D) yields a sensed drain current which corresponds to one of the multiple reference currents that are defined for the partial polarization states 200-3 and 2004 (see FIG. 3C). Moreover, it is to be understood that a dual read operation as shown in FIGS. 3D and 3E is not needed when the FeFET device 100 has a full polarization state (e.g., 200-1 or 200-2) as shown in FIGS. 2A and 2B. In such instances, performing a read operation with the first configuration (e.g., FIGS. 3A and 3D) will generate a drain current which is the same or substantially the same as the drain current that would be generated by performing a second read operation with the second configuration (e.g., FIG. 3E).

In particular, for the polarization state 200-1 shown in FIG. 2A, performing a dual read operation with different read polarities would yield the same (or substantially the same) sensed drain current $I_D1$ due to the first threshold voltage $V_T1$ of the FeFET device 100, which is the same in both regions R1 and R2. Similarly, for the polarization state 200-2 shown in FIG. 2B, performing a dual read operation with different read polarities would yield the same (or substantially the same) sensed drain current $I_D2$ due to the second threshold voltage $V_T2$ of the FeFET device 100, which is the same in both regions R1 and R2. In some embodiments, even when the FeFET device has a fully polarized state, a dual read operation with opposite read polarities can be performed to confirm that the FeFET device 100 has a fully polarized state (e.g., state (0,0) or state (1,1)). In such instances, when a dual read operation is performed, and it is determined that first and second drain currents are substantially equal in magnitude, the first and second currents are compared to the reference currents which correspond to respective logic states of the FeFET device to determine the logic state of the FeFET device 100. The FeFET device 100 will have a logic state which corresponds to the reference current that is determined to be the same or substantially the same as the first and second drain currents.

FIGS. 4A, 4B, 4C, and 4D schematically illustrate a method for programming different states of a multi-level FeFET device, according to an exemplary embodiment of the disclosure. More specifically, FIGS. 4A, 4B, 4C, and 4D schematically illustrate methods 400-1, 400-2, 400-3, and 400-4 for programming the different polarization states 200-1, 200-2, 200-3, 200-4, respectively, of the FeFET device 100 (as shown in FIGS. 2A-2D) using a first programming voltage VP1, wherein the different regions R1 and R2 of the ferroelectric layer 130 can be independently programmed. FIGS. 4A-4D illustrate methods for writing data (e.g., 2 bits of data) to the FeFET device 100.

Figure 4A:
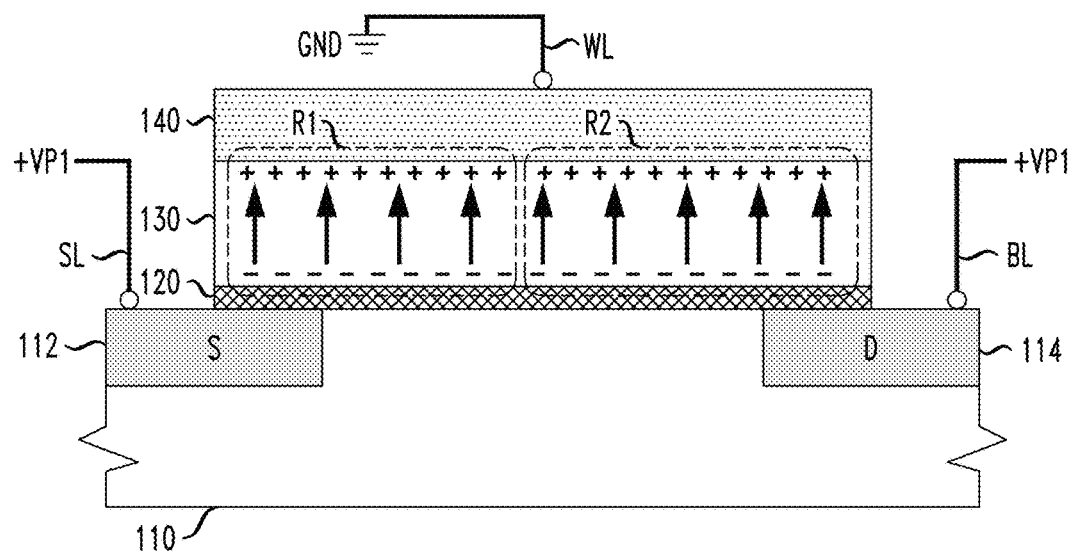
FIGS. 4A, 4B, 4C, and 4D schematically illustrate a method for programming different states of a multi-level FeFET device, according to an exemplary embodiment of the disclosure.

For example, FIG. 4A schematically illustrates an exemplary method 400-1 for programming the FeFET device 100 to have the first polarization state 200-1 (FIG. 2A). In some embodiments, the programming method 400-1 comprises connecting the gate electrode 140 (or word line WL) to ground voltage GND (e.g., V=0), and applying a first programming voltage +VP1 to both the source region 112 (or source line SL) and the drain region 114 (or bit line BL), wherein +VP1 has a sufficient magnitude and duration (pulse width) to change the ferroelectric polarization within all the regions (e.g., R1 and R2) to the first polarity, as shown in FIG. 4A. In this method, the magnitude of the first programming voltage VP1 is equal to or greater than the coercive voltage of ferroelectric domains (e.g., regions R1 and R2) of the ferroelectric layer 130. As noted above, while regions R1 and R2 may comprise separate ferroelectric domains of spontaneous polarization, in some embodiments, the ferroelectric domains are configured to have the same or substantially the same coercive field characteristics, so that the ferroelectric polarization state of both regions R1 and R2 can be switched at the same time (i.e., same programming cycle) by applying +VP1 to the source region 112 and the drain region 114 with the gate electrode 140 connected to ground voltage GND. In other embodiments, programming the FeFET device 100 to have the first polarization state 200-1 (FIG. 2A) can be achieved by, e.g., connecting both the source region 112 and the drain region 114 to ground voltage GND, and applying a negative programming voltage -VP1 to the gate electrode 140 (or word line WL) for a given duration.

Figure 4B:
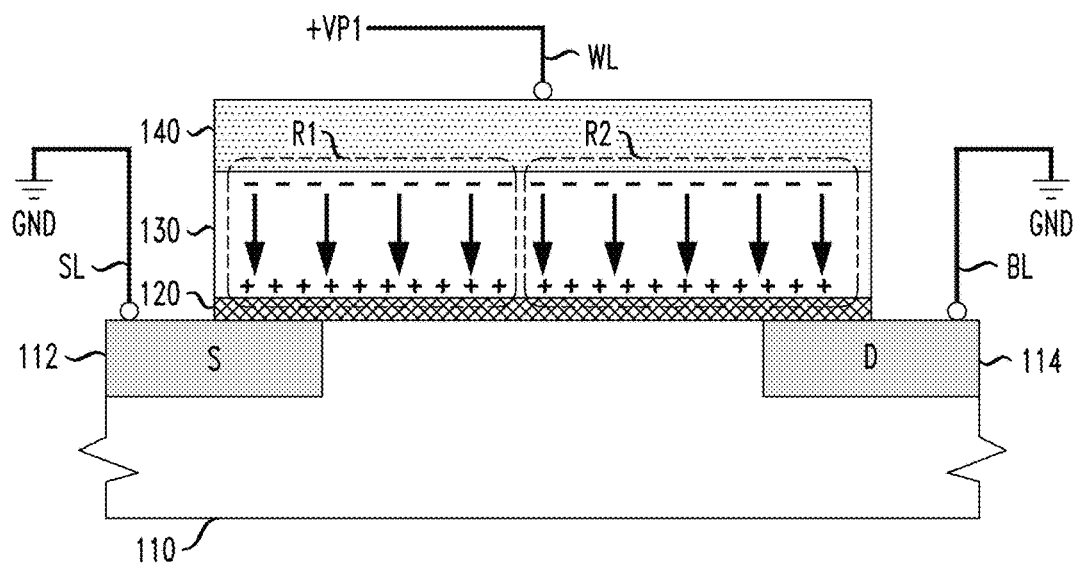

Next, FIG. 4B schematically illustrates an exemplary method 400-2 for programming the FeFET device 100 to have the second polarization state 200-2 (FIG. 2B). In some embodiments, the programming method 400-2 comprises connecting both the source region 112 (or source line SL) and the drain region 114 (or bit line BL) to ground voltage GND, and applying the first programming voltage +VP1 to the gate electrode 140 (or word line), wherein +VP1 has a sufficient magnitude and duration (pulse width) to change the ferroelectric polarization within all the regions (e.g., R1 and R2) to the second polarity, as shown in FIG. 4B. In this method, the ferroelectric polarization state of both regions R1 and R2 are switched at the same time (i.e., same programming cycle) by applying the first programing voltage +VP1 to the gate electrode 140 with both the source region 112 and the drain region 114 connected to ground voltage GND.

Figure 4C:
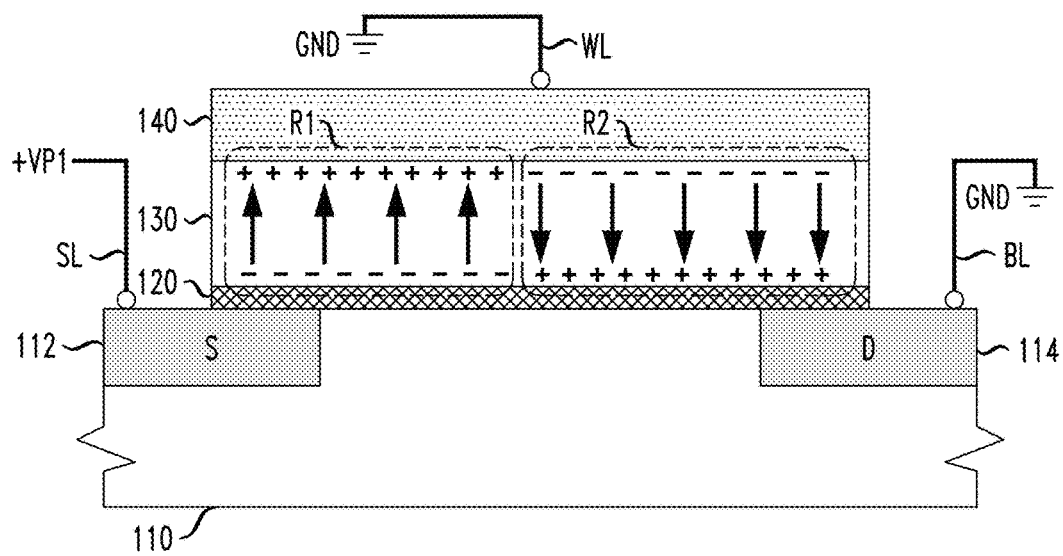

Next, FIG. 4C schematically illustrates an exemplary method 400-3 for programming the FeFET device 100 to have the third polarization state 200-3 (FIG. 2C). In particular, for illustrative purposes, FIG. 4C depicts a programming operation that can be performed to change the polarization state of the FeFET device 100 from the second polarization state 200-2 (as shown in FIGS. 2B and 4B) to the third polarization state 200-3 (FIG. 2C). In some embodiments, the programming method 400-3 comprises connecting both the gate electrode 140 (or word line WL) and the drain region 114 (or bit line BL) to ground voltage GND (e.g., V=0), and applying the first programming voltage +VP1 to the source region 112 (or source line SL) for a sufficient duration (pulse width), to switch the ferroelectric polarization within the first region R1 from the second polarity to the first polarity, while leaving the remnant polarization in the second region R2 at the second polarity. With this process, the source-to-gate voltage +VP1 causes a switch of the ferroelectric polarity within the first region R1, while the drain-to-gate voltage potential of 0V is insufficient to change the ferroelectric polarity within the second region R2. In this manner, the first region R1 of the ferroelectric layer 130 can be programmed independently from the second region R2 of the ferroelectric layer 130.

Figure 4D:
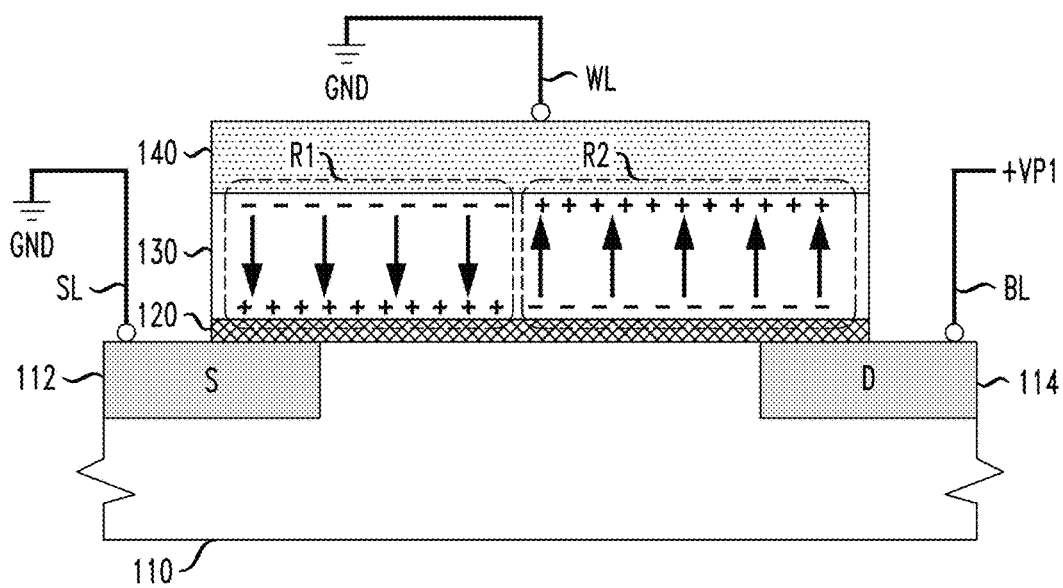

Next, FIG. 4D schematically illustrates an exemplary method 400-4 for programming the FeFET device 100 to have the fourth polarization state 200-4 (FIG. 2D). In particular, for illustrative purposes, FIG. 4D depicts a programming operation that can be performed to change the polarization state of the FeFET device 100 from the second polarization state 200-2 (as shown in FIGS. 2B and 4B) to the fourth polarization state 200-4 (FIG. 2D). In some embodiments, the programming method 400-4 comprises connecting both the gate electrode 140 (or word line WL) and the source region 112 (or source line SL) to ground voltage GND (e.g., V=0), and applying the first programming voltage +VP1 to the drain region 114 (or bit line BL) for a sufficient duration (pulse width), to switch the ferroelectric polarization within the second region R2 from the second polarity to the first polarity, while leaving the remnant polarization in the first region R1 at the second polarity. With this process, the drain-to-gate voltage +VP1 causes a switch of the ferroelectric polarity within the second region R2, while the source-to-gate voltage potential of 0V is insufficient to change the ferroelectric polarity within the first region R1. In this manner, the second region R2 of the ferroelectric layer 130 can be programmed independently from the first region R1 of the ferroelectric layer 130.

In some embodiments, the programming methods shown in FIGS. 4A-4D are implemented in instance where the different regions R1 and R2 comprise "engineered" ferroelectric domains that have distinct sizes. In other embodiments, the same or similar programming methods FIGS. 4A-4D can be applied in instances where the ferroelectric layer 130 has many ferroelectric domains, naturally, wherein the programming the polarization states of ferroelectric layer 130 is performed using partial polarization switching techniques. With such techniques, a process for programming the polarization state of the ferroelectric layer 130 would involve applying a sequence of one or more programming pulses of +VP1 to the source region 112 or to drain region 114 to incrementally increase, or incrementally decrease, the net polarity of the polarization within the given region (e.g., R1 and R2) adjacent the source region 112 or drain region 114 with an increasing programming pulse count.

Figure 4E:
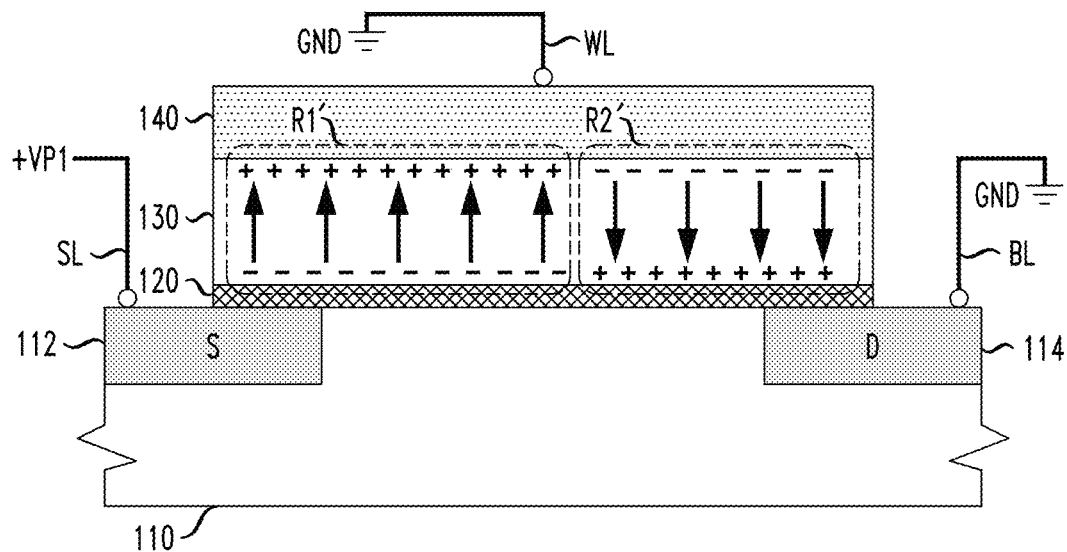
FIGS. 4E and 4F schematically illustrate a method for programming different states of a multi-level FeFET device, according to another exemplary embodiment of the disclosure.
Figure 4F:
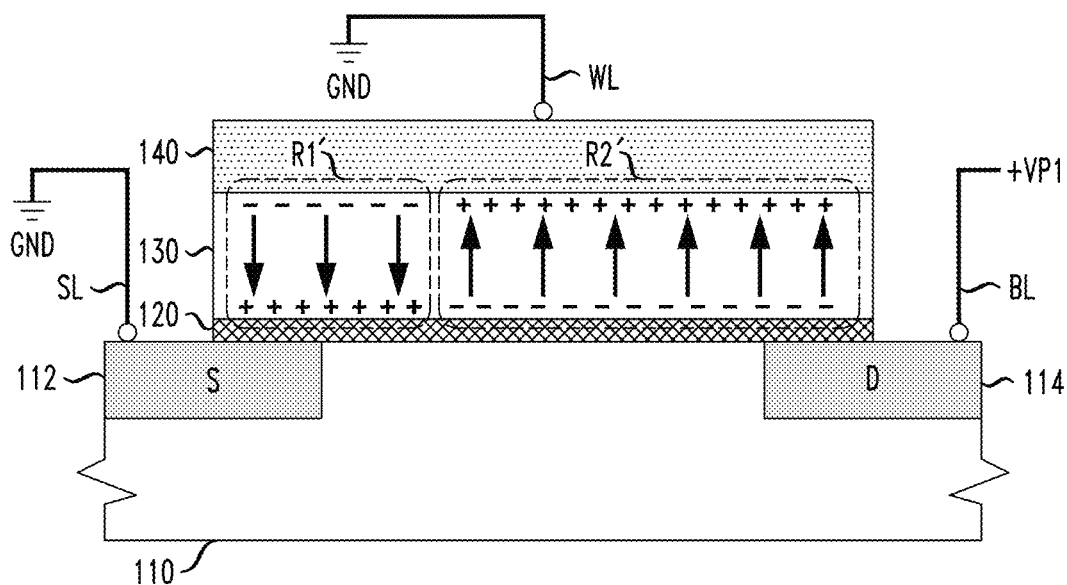

For example, FIGS. 4E and 4F schematically illustrate a method for programming different states of a multi-level FeFET device, according to another exemplary embodiment of the disclosure. More specifically, FIGS. 4E and 4F schematically illustrate an alternate embodiment to achieve additional polarization states of the FeFET device 100 which are encoded by additional threshold voltages Vt5 and Vt6, respectively. In this embodiment, a programming scheme implementing the programming operations of FIGS. 4A-4F would allow the FeFET device 100 to be programmed in one of six (6) different states.

In particular, FIG. 4E schematically illustrates a programming process 400-5, which is a modification of the process 400-3 of FIG. 4C, to increase the net polarization in a first region R1' to obtain an additional polarization state that is encoded by Vt5. The programming process 400-5 can be implemented by applying two or more successive programming pulses +VP1 to the source region 112, wherein the increasing number of programming pulses +VP1 serves to increase the partial polarization switching in the region of the ferroelectric layer 130 adjacent the source region 112 and, thereby incrementally increase the amount of polarization adjacent the source region 112 to achieve a different region R1' of polarization which is larger than the first region R1 of polarization as shown in 4C. In addition, the programming process 400-5 results in a different size region R2' of polarization adjacent the drain region 114, which is smaller than the second region R2 of polarization as shown in FIG. 4C. In some embodiments, the amplitude and/or duration of the programming pulse(s)+VP1 applied to the source region 112 can be modulated to cause an increase in the partial polarization switching of the ferroelectric domains of the ferroelectric layer 130 adjacent the source region 112.

Similarly, FIG. 4F schematically illustrates a programming process 400-6, which is a modification of the process 400-4 of FIG. 4D, to increase the net polarization in a second region R2' to obtain an additional polarization state that is encoded by Vt6. The programming process 400-6 can be implemented by applying two or more successive programming pulses +VP1 to the drain region 112, wherein the increasing number of programming pulses +VP1 serves to increase the partial polarization switching in the region of the ferroelectric layer 130 adjacent the drain region 114 and, thereby incrementally increase the amount of polarization in the region adjacent the drain region 114 to achieve a different region R1' of polarization which is larger than the second region R2 of polarization as shown in 4D. In addition, the programming process 400-6 results in different size region R1' of polarization adjacent the source region 112, which is smaller than the first region R2 of polarization as shown in FIG. 4D. In some embodiments, the amplitude and/or duration of the programming pulse(s)+VP1 applied to the drain region 114 can be modulated to cause an increase in the partial polarization switching of the ferroelectric domains of the ferroelectric layer 130 adjacent the drain region 114.

In other embodiments, FIGS. 4E and 4F illustrate programming methods that can be used to program the partial polarization states of the FeFET device 100 in a multi-level FeFET device 100 that has four different states. In particular, the programming methods shown in FIGS. 4E and 4F can be used to program the (0,1) and (1,0) logic states of the FeFET device 100 in a way that further differentiates the effective threshold voltage $V_T3$ and $V_T4$ of the exemplary 4 state FeFET device 100 discussed above in conjunction with FIGS. 2A-2D. In this instance, the "size" of the different regions R1 and R2 can be tuned, for example, to make the different drain currents $I_D1$, $I_D2$, $I_D3$, and $I_D4$ read currents more distinguishable and more equally spaced apart from each other.

Figure 5A:
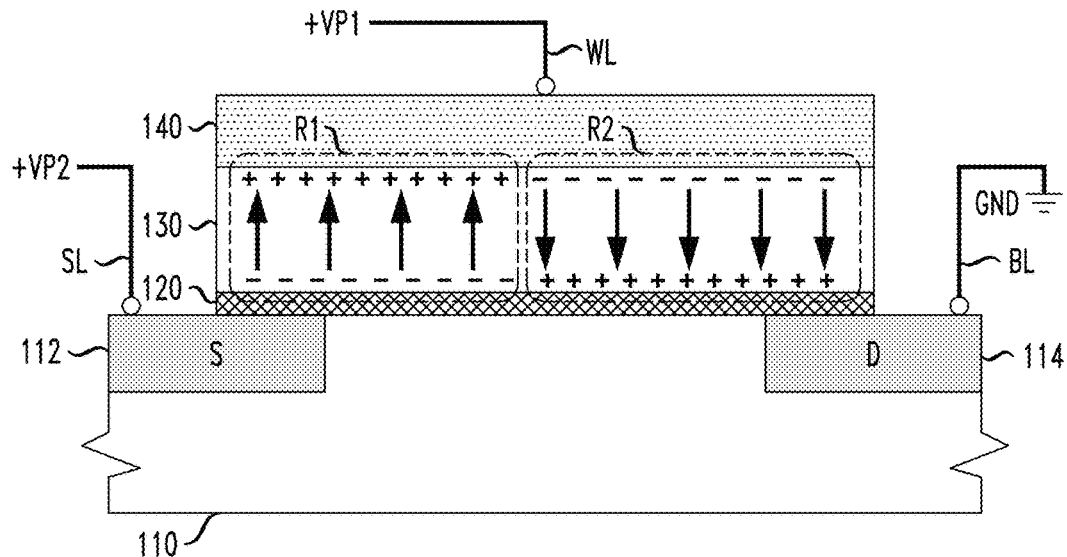
FIGS. 5A and 5B schematically illustrate a method for programming different states of a multi-level FeFET device, according to another exemplary embodiment of the disclosure.
Figure 5B:
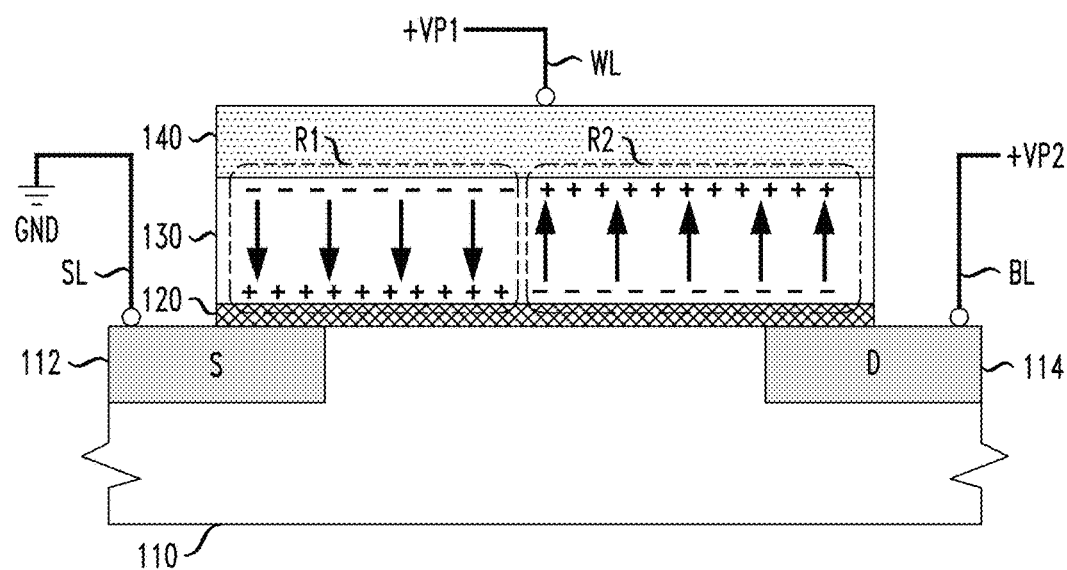

FIGS. 5A and 5B schematically illustrate a method for programming different states of a multi-level FeFET device, according to another exemplary embodiment of the disclosure. More specifically, FIGS. 5A and 5B schematically illustrate methods 500-1 and 500-2 for programming the different polarization states 200-3 and 200-4, respectively, of the FeFET device 100 (as shown in FIGS. 2C and 2D) using a first programming voltage VP1 and a second programming voltage VP2, where VP2>VP1 (e.g., VP2=2×VP1). The programming methods of FIGS. 5A and 5B allow the first and second regions R1 and R2 of the ferroelectric layer 130 to be programmed at the same time (i.e., same programming cycle), while having opposite polarization polarities.

For example, FIG. 5A schematically illustrates an exemplary method 500-1 for programming the FeFET device 100 to have the third polarization state 200-3 (FIG. 2C). In particular, for illustrative purposes, FIG. 5A depicts a programming operation that can be performed to change the polarization state of the FeFET device 100 from the fourth polarization state 200-4 (FIG. 2D) to the third polarization state 200-3 (FIG. 2C). In some embodiments, the programming method 500-1 comprises connecting the drain region 114 (or bit line BL) to ground voltage GND (e.g., V=0), applying the first programming voltage +VP1 to the gate electrode 140 (or word line WL), and applying the second programming voltage +VP2 to the source region 112 (or source line SL), wherein +VP1 and +VP2 are applied for a sufficient duration (pulse width) to switch the ferroelectric polarizations in both regions R1 and R2. In particular, the programming method 500-1 causes the ferroelectric polarization within the first region R1 to switch from the second polarity to the first polarity, and causes the ferroelectric polarization within the second region R2 to switch from the first polarity to the second polarity, resulting in the FeFET device 100 having the third polarization state 200-3.

With the programming method 500-1 of FIG. 5A, the gate-to-drain voltage potential of +VP1 is sufficient to switch the ferroelectric polarity within the second region R2 from the first polarity to the second polarity, while the source-to-gate voltage [(+VP2)−(+VP1)] is sufficient to switch the ferroelectric polarity within the first region R1 from the second polarity to the first polarity. Assuming the ferroelectric domains in both regions R1 and R2 have a coercive voltage that is less than or equal to the VP1, the second programming voltage VP2 should have a magnitude that is at least 2×VP1, so that the voltage difference VP2−VP1>VP1.

Next, FIG. 5B schematically illustrates an exemplary method 500-2 for programming the FeFET device 100 to have the fourth polarization state 200-4 (FIG. 2D). In particular, for illustrative purposes, FIG. 5B depicts a programming operation that can be performed to change the polarization state of the FeFET device 100 from the third polarization state 200-3 (FIG. 2C) to the fourth polarization state 200-4 (FIG. 2D). In some embodiments, the programming method 500-2 comprises connecting the source region 112 (or source line SL) to ground voltage GND (e.g., V=0), applying the first programming voltage +VP1 to the gate electrode 140 (or word line WL), and applying the second programming voltage +VP2 to the drain region 114 (or bit line BL), wherein +VP1 and +VP2 are applied for a sufficient duration (pulse width) to switch the ferroelectric polarizations in both regions R1 and R2. In particular, the programming method 500-2 causes the ferroelectric polarization within the first region R1 to switch from the first polarity to the second polarity, and causes the ferroelectric polarization within the second region R2 to switch from the second polarity to the first polarity, resulting in the FeFET device 100 having the fourth polarization state 200-4.

With the programming method 500-2 of FIG. 5B, the gate-to-source voltage +VP1 is sufficient to switch the ferroelectric polarity within the first region R1 from the first polarity to the second polarity, while the drain-to-gate voltage [(+VP2)−(+VP1)] is sufficient to switch the ferroelectric polarity within the second region R2 from the second polarity to the first polarity. Again, assuming the ferroelectric domains in both regions R1 and R2 have the same (or substantially the same) coercive voltage (less than or equal to the VP1), the second programming voltage VP2 should have a magnitude that is at least 2×VP1, so that the voltage difference VP2−VP1≥VP1. The programming methods 500-1 and 500-2 provide exemplary embodiments to enable concurrent switching of the polarity of the ferroelectric polarization in both the regions R1 and R2 to opposite polarities in instances where both regions R1 and R2 require switching of the polarity to program the FeFET device 100 to have one of the target polarization states 200-3 or 200-4. In other embodiments, the different regions R1 and R2 can be independently programmed in two separate programming operations using the programming methods of FIGS. 4A-4D, as discussed above.

Figure 6:
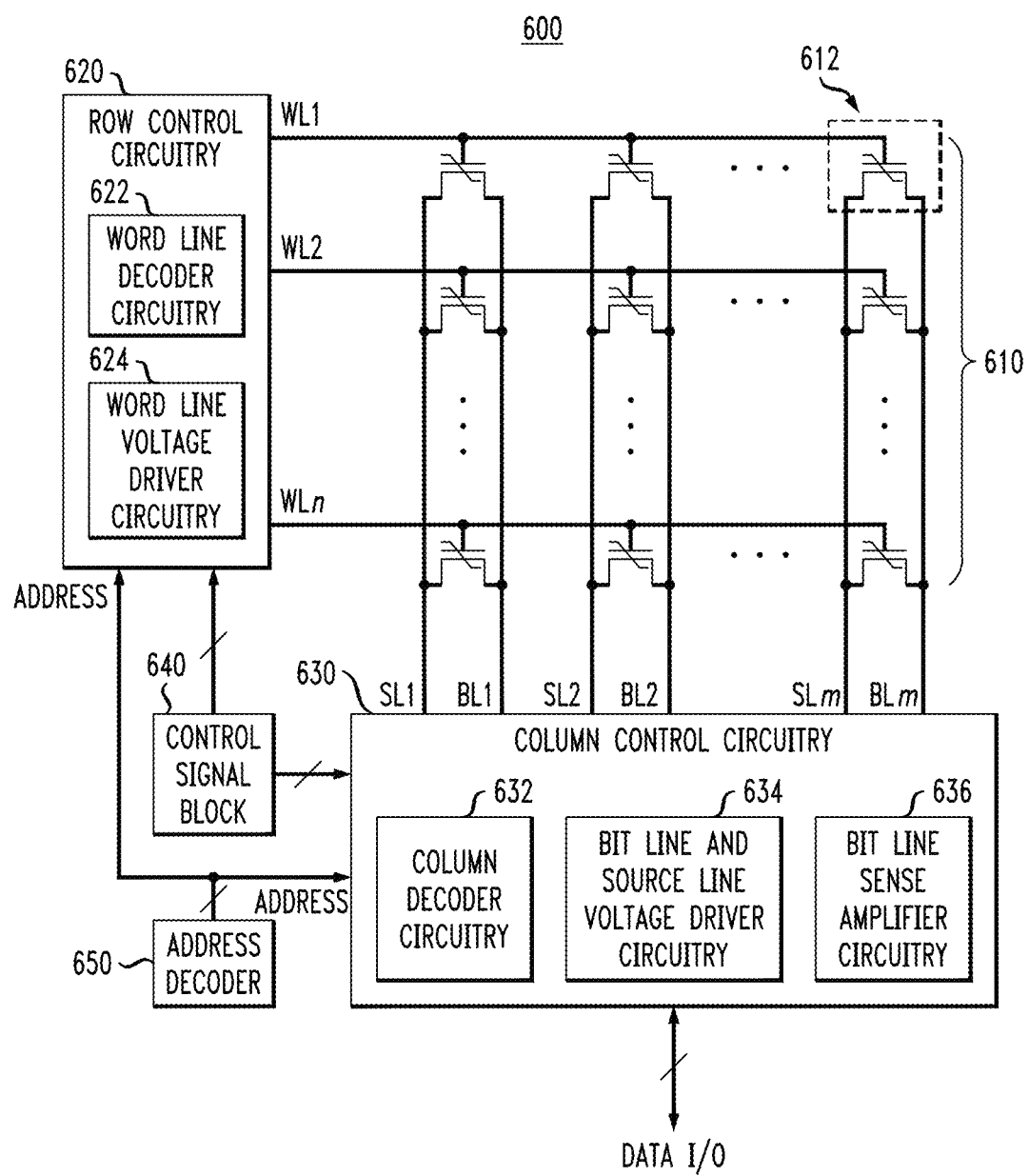
FIG. 6 schematically illustrates a memory device which comprises non-volatile memory cells that are implemented using a multi-level FeFET device, according to an exemplary embodiment of the disclosure.

FIG. 6 schematically illustrates a memory device which comprises non-volatile memory cells that are implemented using a multi-level FeFET device, according to an exemplary embodiment of the disclosure. More specifically, FIG. 6 schematically illustrates a memory device 600 which comprises a memory cell array 610, row control circuitry 620, column control circuitry 630, a control signal block 640, and an address decoder 650. The memory cell array 610 comprises a plurality of non-volatile memory cells 612 arranged in a n×m array of n rows and m columns. In some embodiments, each memory cell 612 comprises a one-transistor (1-T) architecture in which the FeFET device operates as both an access (select) transistor and as a storage element. In some embodiments, each memory cell 612 comprises a multi-level FeFET device which is the same or similar to the FeFET device 100 discussed above, such that each memory cell 612 can store at least 4 different binary logic states.

The memory cell array 610 comprises a plurality (n) of word lines WL1, WL2, . . . , WLn (or more generally, word line(s) WL) which extend in a row direction. Each word line WL is connected to the gate terminals of m FeFET devices of the memory cells 610 in a given row. The memory cell array 610 comprises a plurality (m) of source lines SL1, SL2, . . . , SLm (or more generally, source line(s) SL), and a plurality (m) of bit lines BL1, BL2, . . . , BLm (or more generally, bit line(s) BL). Each column in the memory cell array 610 comprises at least one source line SL and at least one bit line BL. In a given column, each source line SL is connected to the source terminals of n FeFET devices of the memory cells 610 in the given column, and each bit line BL is connected to the drain terminals of n FeFET devices of the memory cells 610 in the given column. Although not specifically shown in FIG. 6, in some embodiments, each column would have another control line connected to the body terminals or well terminals of the FeFET devices within the memory cells 612 within the column. This allows the body substrate or wells of the FeFET devices of the memory cells 612 to be biased, as needed, during programming and read operations, or during idle periods.

The row control circuitry 620 comprises word line decoder circuitry 622 and word line voltage driver circuitry 624. The column control circuitry 630 comprises column decoder circuitry 632, bit line and source line voltage driver circuitry 634, and bit line sense amplifier circuitry 636. The control block 640 comprises circuitry that is configured to generate control signals to control the row control circuitry 620 and the column control circuitry 630. The address decoder 650 is configured to receive an external address from a host, and decode the address into a physical address that is provided to the row control circuitry 620 and the column control circuitry 630 to select one or more memory cells 612 to perform data access operations (e.g., read and write operations).

The row control circuitry 620 is configured to control activation/deactivation of word lines WL to perform read and write operations. More specifically, the word line decoder circuitry 622 is configured to decode an address that is received from the address decoder 650, and determine which word lines WL to activate based on the decoded address. The word line voltage driver circuitry 624 is configured to generate voltage signals (e.g., voltage pulses) for driving the word lines WL during read and write operations. For example, in some embodiments, the word line voltage driver circuitry 624 is configured to (i) generate the first voltage VG_Read when performing read operations (e.g., FIGS. 3A-3E), (ii) generate the programming voltages, e.g., VP1, VP2, GND, etc. when performing write operations (e.g., FIGS. 4A-4F, 5A and 5B), and (iii) generate other voltages that are applied to the word lines which are not selected during a given data access operation and during idle times when the memory 600 is not being utilized. The row control circuitry 620 receives a plurality of control signals from the control signal block 640 including, but not limited to, clock signals, write enable signals, read enable signals, address decode enable signals, etc., to control the operations of the word line decoder circuitry 622 and the word line voltage driver circuitry 624.

The column control circuitry 630 is configured to control activation/deactivation of the source lines SL and bit lines BL (as well as the substrate body/well control lines) to perform read and write operations. More specifically, the column decoder circuitry 632 is configured to decode an address that is received from the address decoder 650, and determine which columns (e.g., source lines SL and bit lines BL) to activate based on the decoded address. The bit line and source line voltage driver circuitry 634 is configured to generate voltage signals (e.g., voltage pulses) for driving the source lines SL and bit lines BL during read and write operations. For example, in some embodiments, the bit line and source line voltage driver circuitry 634 is configured to (i) generate the second voltage VD_Read when performing a read operation to drive the bit lines BL and source lines SL (e.g., first and second source/drain terminals 112 and 114) and operate a given FeFET device of a selected memory cell 612 in a saturation mode (e.g., FIGS. 3A-3E), (ii) generate the programming voltages, e.g., VP1, VP2, GND, etc. to drive the source lines SL and bit lines BL when performing write (programming) operations (e.g., FIGS. 4A-4D, 5A and 5B), and (iii) generate other voltages that are applied to the source lines SL and bit lines BL for columns that are not selected during a given data access operation and during idle times when the memory device 600 is not being utilized.

Further, the bit line sense amplifier circuitry 636 is configured to read or otherwise sense the drain current $I_D$ that is output from a given memory cell 612 on a given bit line BL during a read operation to determine a state of the given memory cell 612. For example, in some embodiments, the bit line sense amplifier circuitry 636 is configured to compare the sensed drain current $I_D$ to each of a plurality of reference currents $I_D1$, $I_D2$, $I_D3$, and $I_D4$ to determine the logic state associated with the sensed current $I_D$ (see e.g., FIG. 3C). The column control circuitry 630 receives a plurality of control signals from the control signal block 640 including, but not limited to, clock signals, write/read enable signals, address decode enable signals, etc., to control the operations of the column control circuitry 630.

It is to be understood that while the exemplary embodiment of FIG. 6 is described in the context of memory cells 612 comprising a 1T FeFET (or 1F) configuration, the exemplary multi-level FeFET devices described herein can be implemented in other suitable types of memory cell configurations. Moreover, the memory device 600 can be implemented in various configurations and applications. For example, in some embodiments, the memory device 600 comprises an integrated circuit (IC) memory device which is implemented as a non-volatile system memory of a computing system or device (e.g., server machine, computer, mobile device, etc.). In other embodiments, the memory device 600 is implemented as a storage resource for a computing system or device (e.g., direct attached storage (DAS), network attached storage (NAS), etc.).

Moreover, while the circuit blocks 620, 630, 640, and 650 are generically depicted in FIG. 6, it is to be understood that the circuit blocks 620, 630, 640, and 650 can be implemented using known circuit configurations and techniques for managing and controlling a non-volatile memory system, which are suitable for the given application. Furthermore, the circuit blocks 620, 630, 640, and 650, together with other circuitry for controlling the memory array, can be implemented as application specific integrated circuits (ASICs), field programmable gate arrays (FPGAs), etc. In addition, the various row and column configurations and control operations can vary depending on how the programming and reading operations are performed, e.g., applying voltages to the word lines, bit lines and source lines to perform read/writing operations for target memory cells to ensure non-destructive readout of the FeFET state of selected memory cells, and to prevent disturbance of the memory state of FeFET devices of non-selected memory cells, etc.

It is to be understood that the various circuit blocks 620, 630, 640, and 650 and associated functionalities collectively comprise a control system which is operatively coupled to the non-volatile memory cell array 610, and configured to perform various operations including, but not limited to, programming the FeFET devices of the non-volatile memory cells 612, and reading the stored logic states of the FeFET devices of the non-volatile memory cells 612, using programming and reading techniques as described above and schematically illustrated in FIGS. 3A-3E, 4A-4F, 5A, and 5B. Moreover, the control system comprises additional components (e.g., circuitry, processors, etc.) to implement memory management functions and perform data access operations, wherein such additional components include, but are limited to, an integrated memory controller, memory/storage interface circuitry, etc.

More specifically, in some embodiments, a control system of the memory device 600 comprises an integrated memory controller (which comprises a combination of hardware, software, and/or firmware) which is configured to communicate with host processors and manage memory operations including, but not limited to, garbage collection, error correction code (ECC), bad block management, and other types of memory management functions that are commonly implemented using an integrated memory controller. Moreover, the control system comprises memory/storage interface circuitry to enable host systems and processors to interface and communicate with the memory device 600 using, for example, one or more known communication and/or storage control protocols. Such protocols include, but are not limited to, Advanced Technology Attachment (ATA), serial ATA (SATA), external SATA (eSATA), parallel ATA (PATA), non-volatile memory express (NVMe), small computer system interface (SCSI), serial attached SCSI (SAS), peripheral component interconnect express (PCIe), Fibre Channel, etc.

It is to be understood that the FeFET devices described herein can be employed in various applications, hardware, and/or electronic systems. Suitable hardware and systems for implementing the exemplary embodiments described herein may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Given the teachings of the exemplary embodiments provided herein, one of ordinary skill in the art will be able to contemplate other implementations and applications of the techniques and devices described herein.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a non-volatile memory comprising an array of non-volatile memory cells, wherein at least one non-volatile memory cell comprises a ferroelectric field-effect transistor (FeFET) device, wherein the FeFET device comprises:
   a first source/drain region and a second source/drain region disposed in an upper surface of a substrate; and
   a gate structure which comprises a ferroelectric layer disposed over the substrate, and a gate electrode disposed over the ferroelectric layer;
   wherein the ferroelectric layer comprises a first region adjacent to the first source/drain region and a second region adjacent to the second source/drain region, wherein the first and second regions of the ferroelectric layer have a same or substantially similar coercive field characteristic; and
   a control system, operatively coupled to the non-volatile memory, to program the FeFET device of the at least one non-volatile memory cell to have a logic state among a plurality of different logic states;
   wherein at least one logic state among the plurality of different logic states corresponds to a polarization state of the FeFET device in which the first and second regions of the ferroelectric layer have respective remnant polarizations with opposite polarities.

2. The device of claim 1, wherein:
   the ferroelectric layer comprises a polycrystalline microstructure comprising a plurality of grains having an average grain size;
   a gate length of the gate structure is at least two times the average grain size of the ferroelectric layer;
   the first region of the ferroelectric layer overlaps a portion of the first source/drain region, and the second region of the ferroelectric layer overlaps a portion of the second source/drain region;
   an amount of overlap between the first source/drain region and the first region of the ferroelectric layer is on an order of at least one average grain size of the ferroelectric layer; and
   an amount of overlap between the second source/drain region and the second region of the ferroelectric layer is on the order of at least one average grain size of the ferroelectric layer.

3. The device of claim 1, wherein the FeFET device comprises an access transistor and a storage element of the at least one non-volatile memory cell.

4. A device, comprising:
a non-volatile memory comprising an array of non-volatile memory cells, wherein at least one non-volatile memory cell comprises a ferroelectric field-effect transistor (FeFET) device, wherein the FeFET device comprises:
   a first source/drain region and a second source/drain region disposed in an upper surface of a substrate; and
   a gate structure which comprises a ferroelectric layer disposed over the substrate, and a gate electrode disposed over the ferroelectric layer;
   wherein the ferroelectric layer comprises a first region adjacent to the first source/drain region and a second region adjacent to the second source/drain region; and
a control system, operatively coupled to the non-volatile memory, to program the FeFET device of the at least one non-volatile memory cell to have a logic state among a plurality of different logic states;
wherein at least one logic state among the plurality of different logic states corresponds to a polarization state of the FeFET device in which the first and second regions of the ferroelectric layer have respective remnant polarizations with opposite polarities;
wherein the first region of the ferroelectric layer comprises a first ferroelectric domain;
wherein the second region of the ferroelectric layer comprises a second ferroelectric domain; and
wherein the first and second ferroelectric domains have a same or a substantially similar coercive field characteristic.

5. The device of claim 4, wherein the FeFET device comprises an access transistor and a storage element of the at least one non-volatile memory cell.

6. A device, comprising:
a non-volatile memory comprising an array of non-volatile memory cells, wherein at least one non-volatile memory cell comprises a ferroelectric field-effect transistor (FeFET) device, wherein the FeFET device comprises:
   a first source/drain region and a second source/drain region disposed in an upper surface of a substrate; and
   a gate structure which comprises a ferroelectric layer disposed over the substrate, and a gate electrode disposed over the ferroelectric layer;
   wherein the ferroelectric layer comprises a first region adjacent to the first source/drain region and a second region adjacent to the second source/drain region; and
a control system, operatively coupled to the non-volatile memory, to program the FeFET device of the at least one non-volatile memory cell to have a logic state among a plurality of different logic states;
wherein at least one logic state among the plurality of different logic states corresponds to a polarization state of the FeFET device in which the first and second regions of the ferroelectric layer have respective remnant polarizations with opposite polarities;
wherein the non-volatile memory further comprises:
   control lines connected to the least one non-volatile memory cell, wherein the control lines comprise a word line connected to the gate electrode of the FeFET device, a source line connected to the first source/drain region of the FeFET device, and a bit line connected to the second source/drain region of the FeFET device;
wherein the control system is operatively coupled to the control lines;
wherein the control system generates programming control voltages on the control lines to program the FeFET device of the least one non-volatile memory cell to store a logic state among the plurality of different logic states represented by at least two bits;
wherein the plurality of different logic states comprises:
   a first logic state which corresponds to a first polarization state of the FeFET device in which the first and second regions each comprise a remnant polarization with a first polarity;
   a second logic state which corresponds to a second polarization state of the FeFET device in which the first and second regions each comprise a remnant polarization with a second polarity which is opposite of the first polarity;
   a third logic state which corresponds to a third polarization state of the FeFET device in which the first region comprises a remnant polarization with the first polarity, and the second region comprises a remnant polarization with the second polarity; and
   a fourth logic state which corresponds to a fourth polarization state of the FeFET device in which the first region comprises a remnant polarization with the second polarity, and the second region comprises a remnant polarization with the first polarity; and
wherein the control system generates read control voltages on the plurality of control lines to perform a read operation in which the read control voltages cause the FeFET device to operate in a saturation mode and generate a current which is sensed by the control system to determine a logic state of the at least one non-volatile memory cell based on the sensed current.

7. The device of claim 6, wherein the FeFET device comprises an access transistor and a storage element of the at least one non-volatile memory cell.

8. The device of claim 6, wherein:
the control system compares the sensed current to a plurality of reference currents to determine the logic state of the at least one non-volatile memory cell; and
the plurality of reference currents comprises a first reference current which corresponds to the first logic state, a second reference current which corresponds to the second logic state, a third reference current which corresponds to the third logic state, and fourth reference current which corresponds to the fourth logic state.

9. The device of claim 6, wherein:
the read operation comprises a first read operation and a second read operation;
the control system performs the first read operation by applying a read voltage having a first read polarity to the first and second source/drain regions of the FeFET device to cause the FeFET device to operate in a saturation mode and generate a first current that is sensed by the control system;
the control system performs the second read operation by applying the read voltage having a second read polarity, opposite of the first read polarity, to the first and second source/drain regions of the FeFET device to cause the FeFET device to operate in a saturation mode and generate a second current that is sensed by the control system;

the control system compares the first and second currents;

the control system determines that the FeFET device has the third polarization state in response to determining that the first current is less than the second current; and the control system determines that the FeFET device has the fourth polarization state in response to determining that the first current is greater than the second current.

10. The device of claim 6, wherein the FeFET device comprises an access transistor and a storage element of the at least one non-volatile memory cell.

11. A method, comprising:

programming a ferroelectric field-effect transistor (FeFET) device to store a given logic state among a plurality of different logic states, wherein the FeFET device comprises first and second source/drain regions, and a gate structure which comprises a ferroelectric layer and a gate electrode disposed over the ferroelectric layer, wherein the ferroelectric layer comprises a first region adjacent to the first source/drain region and a second region adjacent to the second source/drain region, wherein the first and second regions of the ferroelectric layer have a same or substantially similar coercive field characteristic;

wherein programming the FeFET device to store the given logic state comprises programming the FeFET device to have a polarization state in which the first and second regions of the ferroelectric layer have respective remnant polarizations with opposite polarities; and wherein programming the FeFET device comprises performing a first program operation to independently program the first region of the ferroelectric layer, and performing a second program operation to independently program the second region of the ferroelectric layer.

12. The method of claim 11, wherein:

the plurality of different logic states comprises:

a first logic state which corresponds to a first polarization state of the FeFET device in which the first and second regions each comprise a remnant polarization with a first polarity;

a second logic state which corresponds to a second polarization state of the FeFET device in which the first and second regions each comprise a remnant polarization with a second polarity which is opposite of the first polarity;

a third logic state which corresponds to a third polarization state of the FeFET device in which the first region comprises a remnant polarization with the first polarity, and the second region comprises a remnant polarization with the second polarity; and a fourth logic state which corresponds to a fourth polarization state of the FeFET device in which the first region comprises a remnant polarization with the second polarity, and the second region comprises a remnant polarization with the first polarity;

programming the FeFET device to have the first polarization state comprises:

applying a ground voltage to the gate electrode; and applying a first programming voltage to the first source/drain region and to the second source/drain region, wherein a magnitude of the first programming voltage creates a potential difference between the gate electrode and each of the first and second source/drain regions, which is sufficient to switch the polarities of the respective remnant polarizations in the first and second regions to the first polarity;

programming the FeFET device to have the second polarization state comprises:

applying the ground voltage to the first source/drain region and to the second source/drain region; and applying the first programming voltage to the gate electrode, wherein the magnitude of the first programming voltage creates a potential difference between the gate electrode and each of the first and second source/drain regions, which is sufficient to switch the polarities of the respective remnant polarizations in the first and second regions to the second polarity;

programming the FeFET device to have the third polarization state comprises:

applying the ground voltage to the gate electrode and to the second/source drain region; and applying the first programming voltage to the first source/drain region, wherein a magnitude of the first programming voltage creates a potential difference between the gate electrode and the first source/drain region which is sufficient to switch the polarity of the remnant polarization in the first region to the first polarity, while a potential difference between the gate electrode and the second source/drain region is insufficient to switch the polarity of the remnant polarization in the second region such that the second region maintains the remnant polarization with the second polarity; and programming the FeFET device to have the fourth polarization state comprises:

applying the ground voltage to the gate electrode and to the first source/drain region; and applying the first programming voltage to the second source/drain region, wherein a magnitude of the first programming voltage creates a potential difference between the second source/drain region and the gate electrode which is sufficient to switch the polarity of the remnant polarization in the second region to the first polarity, while a potential difference between the gate electrode and the first source/drain region is insufficient to switch the polarity of the remnant polarization in the first region such that the first region maintains the remnant polarization with the second polarity.

13. A method, comprising:

programming a ferroelectric field-effect transistor (FeFET) device to store a given logic state among a plurality of different logic states, wherein the FeFET device comprises first and second source/drain regions, and a gate structure which comprises a ferroelectric layer and a gate electrode disposed over the ferroelectric layer, wherein the ferroelectric layer comprises a first region adjacent to the first source/drain region and a second region adjacent to the second source/drain region, wherein the first and second regions of the ferroelectric layer have a same or substantially similar coercive field characteristic;

wherein programming the FeFET device to store the given logic state comprises programming the FeFET device to have a polarization state in which the first and second regions of the ferroelectric layer have respective remnant polarizations with opposite polarities; and wherein programming the FeFET device comprises performing a program operation to concurrently program the first and second regions of the ferroelectric layer.

14. The method of claim 13, wherein:
the plurality of different logic states comprises:
- a first logic state which corresponds to a first polarization state of the FeFET device in which the first and second regions each comprise a remnant polarization with a first polarity;
- a second logic state which corresponds to a second polarization state of the FeFET device in which the first and second regions each comprise a remnant polarization with a second polarity which is opposite of the first polarity;
- a third logic state which corresponds to a third polarization state of the FeFET device in which the first region comprises a remnant polarization with the first polarity, and the second region comprises a remnant polarization with the second polarity; and
- a fourth logic state which corresponds to a fourth polarization state of the FeFET device in which the first region comprises a remnant polarization with the second polarity, and the second region comprises a remnant polarization with the first polarity;

programming the FeFET device to have the third polarization state comprises:
- applying a ground voltage to the second source/drain region;
- applying a first programming voltage to the gate electrode;
- applying a second programming voltage to the first source/drain region, wherein a magnitude of the second programming voltage is greater than a magnitude of first programming voltage;
- wherein the magnitude of the first programming voltage creates a potential difference between the gate electrode and the second source/drain region which is sufficient to switch the polarity of the remnant polarization in the second region to the second polarity; and
- wherein a difference between the magnitude of the second programming voltage and the magnitude of the first programming voltage creates a potential difference between the first source/drain region and the gate electrode which is sufficient to switch the polarity of the remnant polarization in the first region to the first polarity; and programming the FeFET device to have the fourth polarization state comprises:
- applying the ground voltage to the first source/drain region;
- applying the first programming voltage to the gate electrode; and
- applying the second programming voltage to the second source/drain region;
- wherein the magnitude of the first programming voltage creates a potential difference between the gate electrode and the first source/drain region which is sufficient to switch the polarity of the remnant polarization in the first region to the second polarity; and
- wherein the difference between the magnitude of the second programming voltage and the magnitude of the first programming voltage creates a potential difference between the second source/drain region and the gate electrode which is sufficient to switch the polarity of the remnant polarization in the second region to the first polarity.

15. A method, comprising:
programming a ferroelectric field-effect transistor (FeFET) device to store a given logic state among a plurality of different logic states, wherein the FeFET device comprises first and second source/drain regions, and a gate structure which comprises a ferroelectric layer and a gate electrode disposed over the ferroelectric layer, wherein the ferroelectric layer comprises a first region adjacent to the first source/drain region and a second region adjacent to the second source/drain region;
wherein programming the FeFET device to store the given logic state comprises programming the FeFET device to have a polarization state in which the first and second regions of the ferroelectric layer have respective remnant polarizations with opposite polarities;
wherein the plurality of different logic states comprises:
- a first logic state which corresponds to a first polarization state of the FeFET device in which the first and second regions each comprise a remnant polarization with a first polarity;
- a second logic state which corresponds to a second polarization state of the FeFET device in which the first and second regions each comprise a remnant polarization with a second polarity which is opposite of the first polarity;
- a third logic state which corresponds to a third polarization state of the FeFET device in which the first region comprises a remnant polarization with the first polarity, and the second region comprises a remnant polarization with the second polarity; and
- a fourth logic state which corresponds to a fourth polarization state of the FeFET device in which the first region comprises a remnant polarization with the second polarity, and the second region comprises a remnant polarization with the first polarity;

wherein the first polarization state corresponds to a first threshold voltage of the FeFET device, the second polarization state corresponds to a second threshold voltage of the FeFET device, the third polarization state corresponds to an effective third threshold voltage of the FeFET device, and the fourth polarization state corresponds to an effective fourth threshold voltage of the FeFET device; and wherein the method further comprises performing a read operation to determine a logic state of the FeFET device, wherein the performing the read operation comprises:
- applying a ground voltage to the first source/drain region of the FeFET device;
- applying a first voltage to the gate electrode of the FeFET device, wherein the first voltage comprises a magnitude which greater than the first and second threshold voltages and the effective third and fourth threshold voltages of the FeFET device;
- applying a second voltage to the second source/drain region of the FeFET device, wherein the second voltage comprises a magnitude which provides a drain-to-source voltage that is sufficient to operate the FeFET device in a saturation mode;
- sensing a current generated by the FeFET device operating in the saturation mode; and
- comparing the sensed current to a plurality of reference currents to determine the logic state of the FeFET device.

16. The method of claim 15, wherein the plurality of reference currents comprises a first reference current which corresponds to the first logic state, a second reference current which corresponds to the second logic state, a third reference current which corresponds to the third logic state, and fourth reference current which corresponds to the fourth logic state.

17. A method, comprising:
programming a ferroelectric field-effect transistor (FeFET) device to store a given logic state among a plurality of different logic states, wherein the FeFET device comprises first and second source/drain regions, and a gate structure which comprises a ferroelectric layer and a gate electrode disposed over the ferroelectric layer, wherein the ferroelectric layer comprises a first region adjacent to the first source/drain region and a second region adjacent to the second source/drain region;
wherein programming the FeFET device to store the given logic state comprises programming the FeFET device to have a polarization state in which the first and second regions of the ferroelectric layer have respective remnant polarizations with opposite polarities;
wherein the plurality of different logic states comprises:
 a first logic state which corresponds to a first polarization state of the FeFET device in which the first and second regions each comprise a remnant polarization with a first polarity;
 a second logic state which corresponds to a second polarization state of the FeFET device in which the first and second regions each comprise a remnant polarization with a second polarity which is opposite of the first polarity;
 a third logic state which corresponds to a third polarization state of the FeFET device in which the first region comprises a remnant polarization with the first polarity, and the second region comprises a remnant polarization with the second polarity; and
 a fourth logic state which corresponds to a fourth polarization state of the FeFET device in which the first region comprises a remnant polarization with the second polarity, and the second region comprises a remnant polarization with the first polarity;
wherein the first polarization state corresponds to a first threshold voltage of the FeFET device, the second polarization state corresponds to a second threshold voltage of the FeFET device, the third polarization state corresponds to an effective third threshold voltage of the FeFET device, and the fourth polarization state corresponds to an effective fourth threshold voltage of the FeFET device; and
wherein the method further comprises performing a read operation to determine a logic state of the FeFET device, wherein performing the read operation comprises:
performing a first read operation which comprises:
 applying a ground voltage to the first source/drain region of the FeFET device;
 applying a first voltage to the gate electrode of the FeFET device, wherein the first voltage comprises a magnitude which greater than the first and second threshold voltages and the effective third and fourth threshold voltages of the FeFET device;
 applying a second voltage to the second source/drain region of the FeFET device, wherein the second voltage comprises a magnitude which is sufficient to operate the FeFET device in a saturation mode; and
 sensing a first current generated by the FeFET device operating in the saturation mode; and performing a second read operation which comprises:
 applying the ground voltage to the second source/drain region of the FeFET device;
 applying the first voltage to the gate electrode of the FeFET device;
 applying the second voltage to the first source/drain region of the FeFET device to cause the FeFET device to operate in a saturation mode; and
 sensing a second current generated by the FeFET device operating in the saturation mode; and
comparing the first and second currents;
determining that the FeFET device has the third polarization state in response to determining that the first current is less than the second current; and
determining that the FeFET device has the fourth polarization state in response to determining that the first current is greater than the second current.

18. A method, comprising:
determining a logic state of a ferroelectric field-effect transistor (FeFET) device, wherein the FeFET device comprises first and second source/drain regions, and a gate structure which comprises a ferroelectric layer, wherein the ferroelectric layer comprises a first region adjacent to the first source/drain region and a second region adjacent to the second source/drain region, wherein the logic state of the FeFET device is encoded by a polarization state of the first and second regions of the ferroelectric layer;
wherein determining the logic state of the FeFET device comprises:
performing a first read operation by applying a read voltage having a first read polarity to the first and second source/drain regions of the FeFET device to cause the FeFET device to operate in a saturation mode and generate a first current;
performing a second read operation by applying the read voltage having a second read polarity, opposite the first read polarity, to the first and second source/drain regions of the FeFET device to cause the FeFET device to operate in a saturation mode and generate a second current;
comparing the first and second currents;
determining that the FeFET device has a first logic state which corresponds to a polarization state in which the first region comprises a remnant polarization with a first polarity, and the second region comprises a remnant polarization with a second polarity opposite to the first polarity, in response to determining that the first current is less than the second current; and
determining that the FeFET device has a second logic state which corresponds to a polarization state in which the first region comprises a remnant polarization with the second polarity, and the second region comprises a remnant polarization with the first polarity, in response to determining that the first current is greater than the second current.

19. The method of claim 18, wherein determining the logic state of the FeFET device further comprises:
in response to determining that the first and second currents are substantially equal in magnitude:
comparing the first and second currents to a plurality of reference currents which correspond to respective logic states of the FeFET device;
determining that the FeFET device has a third logic state which corresponds to a polarization state in which the first and second regions each comprise a remnant polarization with the first polarity, in response to determining that the first and second currents are substantially equal to a reference current which corresponds to the third logic state; and determining that the FeFET device has a fourth logic state which corresponds to a polarization state in which the first and second regions each comprise a remnant polarization with the second polarity, in response to determining that the first and second currents are substantially equal to a reference current which corresponds to the fourth logic state.

* * * * *